US012197836B2

(12) United States Patent
Flöther et al.

(10) Patent No.: US 12,197,836 B2
(45) Date of Patent: Jan. 14, 2025

(54) QUANTUM CIRCUIT VALUATION

(71) Applicant: International Business Machines Corporation, Armonk, NY (US)

(72) Inventors: Frederik Frank Flöther, Schlieren (CH); Robert E. Loredo, North Miami Beach, FL (US); Shikhar Kwatra, San Jose, CA (US); Paul R. Bastide, Ashland, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 18/314,206

(22) Filed: May 9, 2023

(65) Prior Publication Data
US 2023/0325568 A1    Oct. 12, 2023

Related U.S. Application Data

(63) Continuation of application No. 17/161,277, filed on Jan. 28, 2021, now Pat. No. 11,681,845.

(51) Int. Cl.
| | | |
|---|---|---|
| G06F 30/337 | (2020.01) | |
| G06N 10/00 | (2022.01) | |
| G06N 10/20 | (2022.01) | |

(52) U.S. Cl.
CPC .......... *G06F 30/337* (2020.01); *G06N 10/00* (2019.01)

(58) Field of Classification Search
CPC ........ G06F 30/337; G06F 30/27; G06F 30/32; G06N 10/00; G06N 3/045; G06N 10/20; G06N 3/084; G06N 3/088; G06N 3/126
See application file for complete search history.

(56) References Cited

U.S. PATENT DOCUMENTS

| | | |
|---|---|---|
| 10,140,404 B2 | 11/2018 | Rigetti et al. |
| 10,325,218 B1 | 6/2019 | Zeng et al. |
| 10,699,209 B2 | 6/2020 | Haener et al. |
| 10,803,395 B2 | 10/2020 | Pistoia et al. |
| 10,810,665 B2 | 10/2020 | Woerner et al. |
| 10,831,455 B2 | 11/2020 | Gambetta et al. |

(Continued)

OTHER PUBLICATIONS

Mell et al., "The NIST Definition of Cloud Computing," Recommendations of the National Institute of Standards and Technology, NIST Special Publication 800-145, Sep. 2011, 7 pages.

(Continued)

*Primary Examiner* — Nghia M Doan

(74) *Attorney, Agent, or Firm* — Amin, Turocy & Watson, LLP

(57) ABSTRACT

Systems and techniques that facilitate quantum circuit valuation are provided. In various embodiments, a system can comprise an input component that can access a first quantum circuit. In various embodiments, the system can further comprise a valuation component that can appraise the first quantum circuit based on one or more factors (e.g., frequency factor, complexity factor, resource factor, similarity factor), thereby yielding a value score that characterizes the first quantum circuit. In various instances, the system can further comprise an execution component that can recommend deployment of the first quantum circuit based on determining that the value score exceeds a threshold.

20 Claims, 19 Drawing Sheets

(56) References Cited

U.S. PATENT DOCUMENTS

| | | | |
|---|---|---|---|
| 10,846,366 | B1 | 11/2020 | Otterbach et al. |
| 11,416,762 | B1* | 8/2022 | Naveh ............... G06N 10/70 |
| 11,615,337 | B1* | 3/2023 | Naveh ............... G06N 10/20 714/10 |
| 2016/0314406 | A1* | 10/2016 | Wiebe ............... G06N 10/00 |
| 2020/0249968 | A1 | 8/2020 | Quintin |
| 2020/0272926 | A1* | 8/2020 | Chaplin ............ G06F 30/337 |
| 2020/0311594 | A1 | 10/2020 | Gidney |
| 2020/0320425 | A1 | 10/2020 | Kelly |
| 2020/0327269 | A1 | 10/2020 | Pond et al. |
| 2020/0342344 | A1 | 10/2020 | Gambetta et al. |

OTHER PUBLICATIONS

Benedetti et al., "A generative modeling approach for benchmarking and training shallow quantum circuits," Nature Partner Journals Quantum Information, 2019, 9 pages.

Wang et al., "Scalable evaluation of quantum-circuit error loss using Clifford sampling," arXiv:2007.10019v1 [quant-ph], 2020, 16 pages.

Oumarou et al., "Quantify: A framework for resource analysis and design verification of quantum circuits," arXiv:2007.10893v1 [quant-ph], 2020, 6 pages.

Yoshimura et al., "Generating Robust Entanglement via Quantum Feedback," arXiv:1808.07204 [quant-ph], 2018, 8 pages.

Lilly et al., "Modeling Noisy Quantum Circuits Using Experimental Characterization," arXiv:2001.08653v1 [quant-ph], 2019, 12 pages.

Jordan, "Algebraic and Number Theoretic Algorithms," Quantum Algorithm Zoo, https://quantumalgorithmzoo.org/, 2019, 47 pages.

Viamontes et al., "Checking Equivalence of Quantum Circuits and States," 6 pages.

Schreiber, "What is . . . a Quantum Circuit Transpiler?," https://towardsdatascience.com/what-is -a-quantum-circuitranspiler-ba9a7853e6f9, 2019, 6 pages.

Ostaszewski et al., "Quantum circuit structure learning," arXiv:1905.09692v2 [quant-ph], 2019, 11 pages.

Nam et al., "Low-cost quantum circuits for classically intractable instances of the Hamiltonian dynamics simulation problem," Nature Partner Journals Quantum Information, 2019, 8 pages.

Paler et al., "Really Small Shoe Boxes—On Realistic Quantum Resource Estimation," arXiv:1902.08104 [quant-ph], 2019, 19 pages.

Zhou et al., "What limits the simulation of quantum computers?," arXiv:2002.07730 [quant-ph], 2020, 14 pages.

Schneeloch et al., "Quantifying entanglement in a 68-billiondimensional quantum state space," Nature communications, 2019, 7 pages.

Krupansky, What Is Quantum Advantage and What Is Quantum Supremacy?, https://jackkrupansky.medium.com/what-is-quantum-advantage-and-what-is-quantum-supremacy-3e63d7c18f5b, 2019, 13 pages.

Siow, "Quantum Value: A new hope," https://medium.com/proteinqure/quantum-value-a-new-hope-82b026cc0961#:-:text=Quantum%20Value%3A%20A%20new%20hope,by%20Lucas%20Siow%20%7C%20ProteinQure%20%7C%20Medium, 2019, 4 pages.

Hietala et al., "A Verified Optimizer for Quantum Circuits," https://www.cs.umd.edu/-mwh/papers/voqc-drafl.pdf, 40 pages.

Wang et al., "Quantifying the magic of quantum channels," arXiv:1903.04483 [quant-ph], 2019, 44 pages.

Qiskit Development Team, "Transpiler Passes and Pass Manager", https://qiskil.org/documentation/tutorials/circuits_advanced/04_transpilerpasses_ and_passmanager.html, 9 pages.

Gambetta, "IBM's Roadmap for Scaling Quantum Technology", https://www.ibm.com/blogs/research/2020/09/ibm-quantum-roadmap/, 9 pages.

Non-Final Office Action received for U.S. Appl. No. 17/161,277, dated Sep. 30, 2022, 22 pages.

Notice of Allowance received for U.S. Appl. No. 17/161,277, dated Feb. 10, 2023, 13 pages.

List of IBM Patents or Applications Treated as Related.

* cited by examiner

QUANTUM CIRCUIT VALUATION

BACKGROUND

The subject disclosure relates to quantum circuits, and more specifically to quantum circuit valuation.

Quantum computing has shown promise in addressing classically-intractable problems in various areas, such as chemistry, machine learning, optimization, and/or simulation. The fundamental reason that quantum computing has advantages compared with classical computing lies in the complexity-theoretic hardness of quantum circuits. Accordingly, quantum circuits are rapidly becoming valuable industrial assets. Thus far, quantum computing research focuses entirely on the design of quantum circuits and/or on the optimization of quantum circuits. In contrast, no quantum computing research focuses on the valuation and/or appraisal of quantum circuits. Thus, systems and/or techniques that can address this technical problem can be desirable.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that can facilitate quantum circuit valuation are described.

According to one or more embodiments, a system is provided. The system can comprise a memory that can store computer-executable components. The system can further comprise a processor that can be operably coupled to the memory and that can execute the computer-executable components stored in the memory. In various embodiments, the computer-executable components can comprise an input component that can access a first quantum circuit. In various aspects, the computer-executable components can further comprise a valuation component that can appraise the first quantum circuit based on one or more factors, thereby yielding a value score that characterizes the first quantum circuit. In various embodiments, the one or more factors can include a frequency factor, and the computer executable components can further comprise a library component that can compile a parametrized library of existing quantum circuits and that can identify one or more nearest neighbors of the first quantum circuit by computing similarity scores between the first quantum circuit and other quantum circuits in the parametrized library of existing quantum circuits. In various instances, the valuation component can compute the frequency factor based on how often the one or more nearest neighbors are executed. In various embodiments, the one or more factors can include a complexity factor, and the valuation component can compute the complexity factor based on a depth of the first quantum circuit, a width of the first quantum circuit, or one or more gate counts of the first quantum circuit. In various embodiments, the one or more factors can include a resource factor, and the valuation component can compute the resource factor based on an amount of pre-processing which the first quantum circuit requires to be executable on a first quantum hardware or an amount of error correction which the first quantum circuit requires to be executable on the first quantum hardware.

According to one or more embodiments, the above-described system can be implemented as a computer-implemented method and/or computer program product.

DETAILED DESCRIPTION

Figure 1:
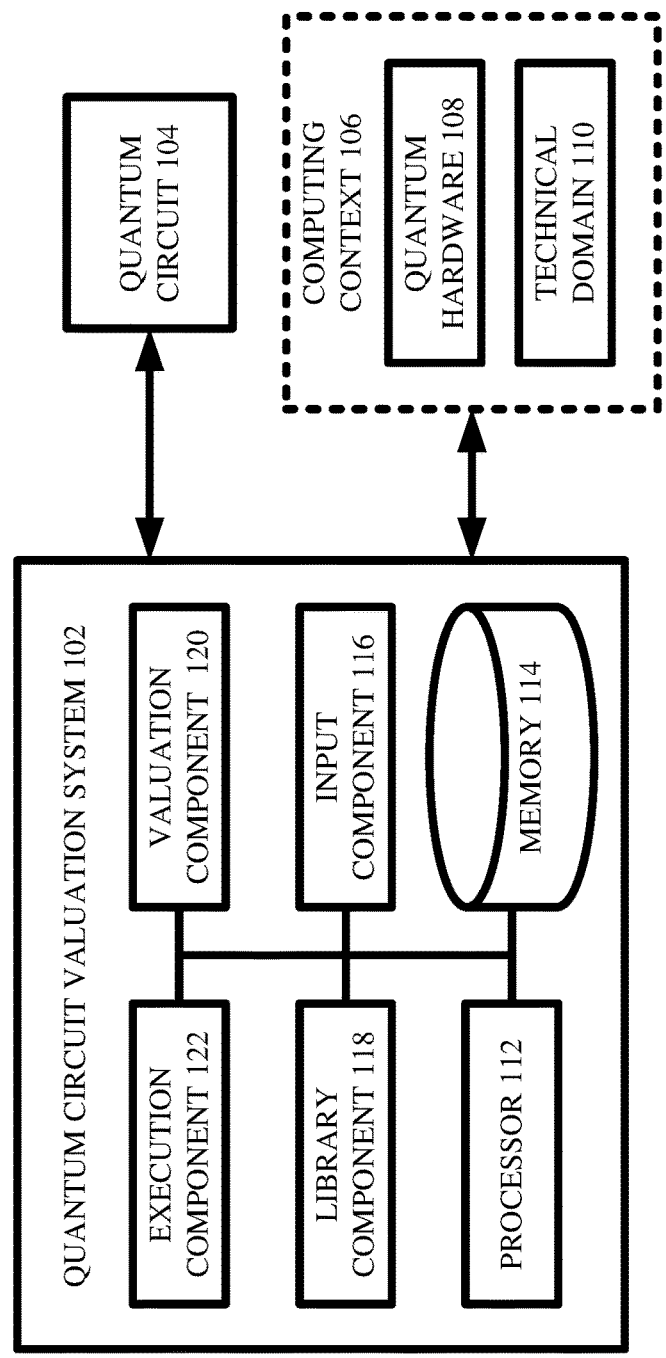
FIG. 1 illustrates a block diagram of an example, non-limiting system that facilitates quantum circuit valuation in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As mentioned above, quantum computing has shown promise in addressing classically-intractable problems in various technical fields, such as chemistry, machine learning, optimization, and/or simulation. The fundamental reason that quantum computing can handle classically-intractable problems lies in the complexity-theoretic hardness of quantum circuits. A quantum circuit can be a sequence of quantum gates (e.g., unitary matrix operators that transform/rotate the states of qubits) that are combined in series (e.g., via matrix multiplication) and/or in parallel (e.g., via tensor products and/or Kronecker products). Different quantum circuits can perform different transformations on the quantum states of qubit devices, thereby achieving different computational results. Because of quantum supremacy, quantum circuits are rapidly becoming valuable industrial assets.

To date, much research has been conducted in the realm of quantum computing, but such research focuses entirely on the design of quantum circuits and/or on the optimization of quantum circuits (e.g., focuses on techniques that identify substantively equivalent quantum circuits that have reduced gate counts). In contrast, no quantum computing research focuses on the valuation and/or appraisal of quantum circuits. In other words, no systems and/or techniques have been developed that can objectively analyze a worth and/or a level of industrial value of a quantum circuit.

This can be problematic because, without systems and/or techniques that can assess and/or appraise the value of quantum circuits, quantum researchers can lack reliable methodologies for ranking and/or comparing different quantum circuits against one another. This can lead to situations in which quantum researchers are unable to engage in objective triage decision making regarding the expenditure of limited computational resources on quantum circuits. For instance, consider a quantum researcher that desires to apply optimization techniques to more than one quantum circuit. With the current state of the art, the quantum researcher does not have an objective methodology for deciding the order in which the more than one quantum circuits are optimized (e.g., the quantum researcher may desire to first optimize the most valuable and/or important quantum circuit, but the quantum researcher has no objective technique for identifying such quantum circuit). As another example, consider a company that has invested much time and/or many resources into designing and/or optimizing more than one quantum circuit. With the current state of the art, the company has no objective methodology for deciding which quantum circuits to offer to which clients and/or at what prices the quantum circuits should be offered. In various aspects, these problems stem from the lack of systems and/or techniques that can appraise (e.g., assess the value, worth, and/or importance of) quantum circuits.

Various embodiments of the invention can address one or more of these technical problems. Specifically, various embodiments of the invention can provide systems and/or techniques that can facilitate quantum circuit valuation. In various aspects, embodiments of the invention can be considered as a computerized tool (e.g., computer-implemented software) that can electronically receive as input a quantum circuit, and that can electronically produce as output a score (e.g., a scalar) that characterizes a level of value, worth, and/or importance of the inputted quantum circuit. In various instances, such a computerized tool can be considered as appraising the inputted quantum circuit. In various cases, such a computerized tool can be beneficial because it can assign different value scores to different quantum circuits, thereby allowing those different quantum circuits to be compared and/or ranked against each other (e.g., quantum circuit optimization can be triaged in order of descending value score, quantum circuits can be recommended to clients in order of descending value score, prices for the sale/rent of quantum circuits can be proportional to value score).

Specifically, in various aspects, such a computerized tool can comprise an input component, a library component, a valuation component, and an execution component.

In various embodiments, the input component can electronically receive and/or otherwise electronically access a quantum circuit that is desired to be appraised. In various cases, the input component can electronically retrieve the quantum circuit from any suitable centralized and/or decentralized data structure (e.g., graph data structure, relational data structure, hybrid data structure), whether remote from and/or local to the input component.

In various aspects, the input component can further electronically receive and/or otherwise electronically access a computing context associated with the quantum circuit. In various cases, the computing context can be electronic data that includes an indication of a quantum hardware (e.g., a specific physical qubit connectivity, topology, and/or layout; a specific physical qubit device construction) on which it is desired to execute the quantum circuit. In various cases, the computing context can be electronic information that includes an indication of a technical domain (e.g., field of use such as machine learning, computational chemistry, weather forecasting, logistics optimization, cyber security, cryptography, financial modeling) in which it is desired to deploy the quantum circuit.

In other words, the input component can receive the quantum circuit and the computing context in which it is desired to deploy the quantum circuit. As explained herein, the computerized tool can assign a value score to the quantum circuit based on characteristics of the quantum circuit and/or based on the computing context, which value score can be considered as an appraisal of the quantum circuit and/or as a level of worth/importance of the quantum circuit. In other words, the value score can be considered as denoting how valuable the inputted quantum circuit would be if the inputted quantum circuit were actually deployed in the computing context.

In various cases, the inventors of various embodiments of the invention recognized that the value, worth, and/or importance of a quantum circuit can depend upon how often the quantum circuit and/or similar quantum circuits are actually executed/deployed, how the quantum circuit is structured, how much pre-processing and/or post-processing the quantum circuit would require if executed/deployed in a particular computing context, and/or how similar the quantum circuit is to other circuits that are known to be effective in the particular computing context. The computerized tool described herein can take such considerations into account when appraising the inputted quantum circuit, as described below.

In various embodiments, the library component can electronically compile and/or otherwise electronically maintain a parametrized library of existing quantum circuits. In various instances, a quantum circuit can be represented in the parametrized library by a parameter tuple. In various cases, the parametrized library can list and/or contain any suitable number of parameter tuples, meaning that any suitable number of quantum circuits can be represented in the parametrized library. In various aspects, any suitable parameters can be included in a parameter tuple; that is, any suitable parameters can be used to represent quantum circuits. For example, such parameters can include total gate count (e.g., a given quantum circuit can be represented by the total number of quantum gates that it utilizes), granular gate counts (e.g., a given quantum circuit can be represented by the numbers of specific quantum gates that it utilizes, such as number of CNOT gates, number of SWAP gates, number of Toffoli gates), circuit depth (e.g., a given quantum circuit can be represented by the minimum number of parallel quantum gate steps that it utilizes), circuit width (e.g., a given quantum circuit can be represented by the number of qubits that it utilizes), resultant quantum states (e.g., a given quantum circuit can be represented by the outputted quantum states that it returns when fed a particular set of input quantum states), computation time (e.g., a given quantum circuit can be represented by the amount of time it consumes to execute), number of executions (e.g., a given quantum circuit can be represented by the number of times it has been executed/deployed with any suitable time interval), and/or technical domain (e.g., a given quantum circuit can be represented by the field of use in which it is deployed, such as machine learning, computational chemistry, weather forecasting, logistics optimization, cyber security, cryptography, and/or financial modeling).

As an example, suppose that the parametrized library represents quantum circuits according to total gate count, circuit depth, and circuit width. Moreover, suppose that a particular quantum circuit has 54 total quantum gates, has a depth of 17, and has a width of 5. In such case, the particular quantum circuit can be represented by the 3-element parameter tuple (54, 17, 5). It should be understood that this is a non-limiting example for purposes of illustration.

In various instances, the library component can place and/or insert the inputted quantum circuit into the parametrized library. That is, in some cases, the library component can electronically generate a parameter tuple that represents the inputted quantum circuit. In other cases, a parameter tuple representing the inputted quantum circuit can already exist (e.g., can be retrieved by the input component along with the inputted quantum circuit).

In various embodiments, the library component can compute similarity scores between the inputted quantum circuit and other quantum circuits that are represented in the parametrized library. More specifically, as those having ordinary skill in the art will appreciate, parameter tuples can be considered as vectors, and so vector operations/computations can be performed on parameter tuples. Thus, in various cases, the library component can compute similarity scores by calculating Euclidean distances between parameter tuples and/or by calculating cosine similarities between parameter tuples. In other words, the library component can measure a level of similarity between two parameter tuples by computing a distance and/or an angle separating those two parameter tuples.

For example, suppose that a particular quantum circuit is represented by an x-element parameter tuple A, for any suitable positive integer x, and suppose that the inputted quantum circuit is represented by an x-element parameter tuple B. In such case, A and B can be considered as x-element vectors. In various instances, a similarity score between the particular quantum circuit and the inputted quantum circuit can be equal to the Euclidean distance between A and B, which can be given by: $\sqrt{\Sigma_{i=1}^{x}(A_i-B_i)^2}$. In some cases, however, the similarity score between the particular 1 quantum circuit and the inputted quantum circuit can be equal to a normalized Euclidean distance value (e.g., can be equal to the quotient between the above-computed Euclidean distance value and a maximum Euclidean distance value). In cases where Euclidean distances are implemented, a numerically high similarity score can represent more distance between A and B, which can mean that the particular quantum circuit and the inputted quantum circuit are less similar. Those having ordinary skill in the art will appreciate that, if it is desired to define similarity scores such that higher numerical values indicate more similarity, the reciprocal of Euclidean distance can be implemented.

In other cases, a similarity score between the particular quantum circuit and the inputted quantum circuit can be equal to a cosine similarity between A and B, which can be given by:

$$\frac{A \cdot B}{\|A\|\|B\|}.$$

In cases where cosine similarities are implemented, a numerically high similarity score can represent a small angle between A and B, which can mean that the particular quantum circuit and the inputted quantum circuit are more similar. Those having ordinary skill in the art will appreciate that, if it is desired to define similarity scores such that higher numerical values indicate less similarity, the reciprocal of cosine similarity can be implemented.

In various cases, a similarity score can be computed based on any suitable mathematical manipulations of Euclidean distance and/or cosine similarity. Those having ordinary skill in the art will appreciate that Euclidean distance and/or cosine similarity are mere non-limiting examples of how similarity scores can be computed between different parameter tuples. In any case, the distance and/or angle between two parameter tuples can be computed so as to measure a level of similarity between those two parameter tuples.

In various embodiments, the library component can compute any suitable number of similarity scores. For instance, the library component can, in some cases, compute a similarity score between the inputted quantum circuit and every other quantum circuit that is represented in the parametrized library. In such case, if the parametrized library includes y quantum circuits in addition to the inputted quantum circuit, the library component can compute y similarity scores, for any suitable positive integer y. In other cases, however, the library component can compute fewer similarity scores (e.g., can refrain from computing a similarity score between the inputted quantum circuit and one or more other quantum circuits in the parametrized library).

In various aspects, the library component can rank the computed similarity scores in order of increasing and/or decreasing similarity, and the library component can identify n nearest neighbors of the inputted quantum circuit by identifying the n highest similarity scores, for any suitable positive integer n. Those having ordinary skill in the art will appreciate that this applies when a numerically high similarity score indicates a high level of similarity. Those having ordinary skill in the art will further appreciate that if a numerically high similarity score instead indicates a low level of similarity, then the n nearest neighbors of the inputted quantum circuit can be identified by identifying the n lowest similarity scores. In any case, n quantum circuits that are most similar to the inputted quantum circuit can be identified by the library component based on the computed similarity scores.

In various embodiments, the valuation component can compute a frequency factor for the inputted quantum circuit. As mentioned above, the inventors of various embodiments of the invention recognized that the total value, worth, and/or importance of a quantum circuit can depend upon how often the quantum circuit is executed/deployed (e.g., how popular the quantum circuit is). As explained herein, the frequency factor can account for such popularity. In various cases, the frequency factor can be a scalar that represents how often the inputted quantum circuit has been executed and/or deployed in the past. That is, the magnitude of the frequency factor can be based on the number executions and/or deployments of the inputted quantum circuit. In various instances, it can be the case that the inputted quantum circuit is a newly-designed circuit that has not yet been executed and/or deployed. In such case, the magnitude of the frequency factor can be based on how often the n nearest neighbors have been executed and/or deployed in the past. In various aspects, the magnitude of the frequency factor can be any suitable function of the number of executions/deployments of the inputted quantum circuit and/or of the number of executions/deployments of the n nearest neighbors. For example, in some cases, the magnitude of the frequency factor can be equal to the average number of executions/deployments of the n nearest neighbors. As another example, in some cases, the magnitude of the frequency factor can be normalized (e.g., such as by a sigmoid function) to be between 0 and 1. In any case, any suitable mathematical functions (e.g., continuous functions, piece-wise functions) can be used to define the magnitude of the frequency factor, such that the frequency factor represents how often the inputted quantum circuit and/or the n nearest neighbors of the inputted quantum circuit have been executed/deployed in any suitable time window (e.g., the frequency factor can be defined so that higher values indicate more executions/deployments in a given time window; or the frequency factor can be defined so that higher values indicate fewer executions/deployments in a given time window).

In various embodiments, the valuation component can compute a complexity factor for the inputted quantum circuit. As mentioned above, the inventors of various embodiments of the invention recognized that the total value, worth, and/or importance of a quantum circuit can depend upon how the quantum circuit is structured. As explained herein, the complexity factor can account for such structure. In various cases, the complexity factor can be a scalar that represents the structure of the inputted quantum circuit. That is, the magnitude of the frequency factor can be based on the total gate count of the inputted quantum circuit, on one or more granular gate counts of the inputted quantum circuit, on the circuit depth of the inputted quantum circuit, and/or on the circuit width of the inputted quantum circuit. In various aspects, the magnitude of the complexity factor can be any suitable function of the total gate count, one or more granular gate counts, circuit depth, and/or circuit width of the inputted quantum circuit. For example, in some cases, the magnitude of the complexity factor can be equal to a weighted and/or unweighted linear combination of the total gate count, one or more granular gate counts, circuit depth, and/or circuit width of the inputted quantum circuit. As another example, in some cases, the magnitude of the complexity factor can be equal to an exponentially-weighted and/or exponentially-unweighted multiplicative combination of the total gate count, one or more granular gate counts, circuit depth, and/or circuit width of the inputted quantum circuit. As yet another example, in some cases, the magnitude of the complexity factor can be normalized (e.g., such as by a sigmoid function) to be between 0 and 1. In any case, any suitable mathematical functions (e.g., continuous functions, piece-wise functions) can be used to define the magnitude of the complexity factor, such that the complexity factor represents the structure of the inputted quantum circuit (e.g., the complexity factor can be defined so that higher values indicate more complex structure; or the complexity factor can be defined so that higher values indicate less complex structure).

In various embodiments, the valuation component can compute a resource factor for the inputted quantum circuit. As those having ordinary skill in the art will appreciate, some quantum circuits require specialized quantum hardware for execution (e.g., some quantum circuits can be executed only on specialized physical qubit topologies/connectivities/layouts, some quantum gates can be executed only on specialized physical qubit constructions). In various cases, the resource factor can be a scalar that represents a level of resources and/or preparation that would have to be expended on the inputted quantum circuit in order to make the inputted quantum circuit executable on the quantum hardware identified in the computing context received by the input component. In various aspects, the magnitude of the resource factor can be any suitable function of an amount of pre-processing (e.g., gate transpiling, data formatting) which the inputted quantum circuit would have to undergo in order to be executable on the identified quantum hardware. In various instances, the magnitude of the resource factor can be any suitable function of an amount of post-processing (e.g., error correction) which the inputted quantum circuit would have to undergo to be executable on the identified quantum hardware. For example, in some cases, the resource factor can be equal to a weighted and/or unweighted linear combination of an amount of gate transpiling and/or an amount of error correction needed by the inputted quantum circuit to be executable on the identified quantum hardware. As another example, in some cases, the magnitude of the resource factor can be equal to an exponentially-weighted and/or exponentially-unweighted multiplicative combination of the amount of gate transpiling and/or the amount of error correction needed by the inputted quantum circuit to be executable on the identified quantum hardware. As yet another example, in some cases, the magnitude of the resource factor can be normalized (e.g., such as by a sigmoid function) to be between 0 and 1. In any case, any suitable mathematical functions (e.g., continuous functions, piece-wise functions) can be used to define the magnitude of the resource factor, such that the resource factor represents the amount of pre-processing and/or post-processing which the inputted quantum circuit requires to be executable on the identified quantum hardware (e.g., the resource factor can be defined so that higher values indicate more pre-processing and/or post-processing; or the resource factor can be defined so that higher values indicate less pre-processing and/or post-processing).

In various embodiments, the valuation component can compute a similarity factor for the inputted quantum circuit. As those having ordinary skill in the art will appreciate, some quantum circuits can be more effective when implemented in certain technical domains than when implemented in other technical domains (e.g., some quantum circuits can be more effective in the field of computational chemistry than in the field of weather forecasting). In various cases, the similarity factor can be a scalar that represents how well-suited the inputted quantum circuit would be if implemented/deployed in the technical domain identified in the computing context received by the input component. In various aspects, the library component can cluster the parametrized library according to technical domain, and the library component can compute similarity scores between the inputted quantum circuit and any quantum circuits that are associated with the technical domain identified in the computing context. In various instances, the magnitude of the similarity factor can be any suitable function of those similarity scores. For example, in some cases, the similarity factor can be equal to the average of the similarity scores between the inputted quantum circuit and the cluster of circuits that are associated with the identified technical domain. As another example, in some cases, the magnitude of the similarity factor can be normalized (e.g., such as by a sigmoid function) to be between 0 and 1. In any case, any suitable mathematical functions (e.g., continuous functions, piece-wise functions) can be used to define the magnitude of the similarity factor, such that the similarity factor represents how similar the inputted quantum circuit is to other quantum circuits that are known to be effective in the identified technical domain (e.g., the similarity factor can be defined so that higher values indicate more similarity; or the similarity factor can be defined so that higher values indicate less similarity).

In various embodiments, the valuation component can combine and/or aggregate the frequency factor, the complexity factor, the resource factor, and/or the similarity factor via a valuation formula, thereby yielding a value score for the inputted quantum circuit. In some cases, the valuation formula can be a weighted and/or unweighted linear combination of the frequency factor, the complexity factor, the resource factor, and/or the similarity factor. In other cases, the valuation formula can be an exponentially-weighted and/or exponentially-unweighted multiplicative combination of the frequency factor, the complexity factor, the resource factor, and/or the similarity factor. In still other cases, the valuation formula can involve normalization (e.g., via a sigmoid function) so that magnitude of the value score is between 0 and 1. In any case, the valuation formula can be any suitable mathematical function that takes as arguments the frequency factor, the complexity factor, the resource factor, and/or the similarity factor, and that outputs a value score (e.g., a scalar) that indicates and/or represents a level of value, worth, and/or importance of the inputted quantum circuit (e.g., the value score can be defined so that higher magnitudes indicate more value/worth/importance; or the value score can be defined so that higher magnitudes indicate lower value/worth/importance).

That is, the computerized tool described herein can, in various aspects, receive as input a quantum circuit and a computing context in which it is desired to execute/deploy the quantum circuit, and can produce as output a value score that represents how valuable the inputted quantum circuit would be if it were actually executed/deployed in the inputted computing context. In other words, the computerized tool can be considered as appraising the inputted quantum circuit. As explained herein, the computerized tool can facilitate this appraisal on the basis of how often the inputted quantum circuit is executed, how often circuits that are similar to the inputted quantum circuit are executed, how complex the structure of the inputted quantum circuit is, how much preparation the inputted quantum circuit would need to be executable on a particular quantum hardware, and/or how similar the inputted quantum circuit is to other circuits that are known to be effective in a particular technical domain.

In various embodiments, the execution component can electronically compare the computed value score with any suitable threshold, and can take action based on the comparison. For example, in some cases, the execution component can recommend that the inputted quantum circuit be executed in the inputted computing context based on determining that the value score exceeds the threshold, and/or the execution component can recommend that the inputted quantum circuit not be executed in the inputted computing context based on determining that the value score does not exceed the threshold. As another example, in some cases, the execution component can execute and/or can otherwise cause to be executed the inputted quantum circuit in the inputted computing context based on determining that the value score exceeds the threshold, and/or the execution component can refrain from executing the inputted quantum circuit in the inputted computing context based on determining that the value score does not exceed the threshold. Those having ordinary skill in the art will appreciate that these are mere non-limiting examples of actions that can be taken/initiated based on the magnitude of the computed value score.

In various embodiments, the computerized tool can further comprise a feedback component. In various aspects, the feedback component can electronically receive feedback from entities (e.g., quantum researchers), and the valuation component incorporate such feedback to iteratively update the value score of the inputted quantum circuit. For example, in some cases, the inputted quantum circuit can be actually distributed to quantum researchers and/or to clients, and the number of actual executions/deployments of the inputted quantum circuit by the quantum researchers and/or clients can be recorded. Accordingly, the valuation component can update the frequency factor based on how many times the quantum researchers and/or clients actually used the inputted quantum circuit.

In some aspects, the feedback component can include a generative adversarial network (e.g., GAN). As those having ordinary skill in the art will appreciate, a GAN can include two neural networks that function as adversaries. Specifically, a GAN can include a first neural network called a generator, that is configured to receive a random input scalar/vector and to synthesize a data candidate based on that random input scalar/vector, wherein the data candidate complies with a training data distribution. Moreover, the GAN can include a second neural network called a discriminator, that is configured to receive a data candidate and to determine whether the data candidate is genuine (e.g., from the training data distribution) or synthesized (e.g., produced by the generator). In various cases, parameters of the discriminator and/or generator can be iteratively updated (e.g., via backpropagation) during training, with the eventual result that the generator becomes so good at synthesizing data candidates that the discriminator is not able to reliably tell the difference between genuine and synthesized data candidates.

As mentioned above, the valuation component can compute the value score based on a valuation formula that takes as arguments the frequency factor, the complexity factor, the resource factor, and/or the similarity factor. In various instances, the GAN of the feedback component can comprise a generator that is configured to receive a random scalar/vector and to synthesize, based on that random scalar/vector, a modified version of the valuation formula. Furthermore, the GAN of the feedback component can comprise a discriminator that is configured to receive a valuation formula and to determine how well that valuation formula separates known high-value and known low-value circuits in the parametrized library. Accordingly, the GAN of the feedback component can be trained (e.g., in a reinforcement learning fashion) to iteratively update/improve the valuation formula.

For example, the valuation formula employed by the valuation component can, in some cases be an exponentially-weighted multiplicative combination formula, as follows: $V = F^a C^b R^c S^d$, where V represents the value score, F represents the frequency factor, C represents the complexity factor, R represents the resource factor, S represents the similarity factor, a represents the exponential weight of the frequency factor, b represents the exponential weight of the complexity factor, c represents the exponential weight of the resource factor, and d represents the exponential weight of the similarity factor. Note that in this non-limiting example, a higher magnitude for F can indicate more executions/deployments, a higher magnitude for C can indicate a more complex structure, a higher magnitude for R can indicate less required pre-processing and/or post-processing, and a higher magnitude for S can indicate more similarity. Accordingly, a higher magnitude for V can represent more value/worth/importance. In various cases, the exponents a, b, c, and/or d can be initialized in any suitable way (e.g., randomly initialized, initialized with best guesses), and the GAN of the feedback component can iteratively modify the values of the exponents a, b, c, and/or d until the valuation formula accurately distinguishes between known high-value and known low-value circuits in the parametrized library. In this way, an optimized valuation formula can be obtained. In various aspects, the valuation component can then use the optimized valuation formula to compute the value score for the inputted quantum circuit and/or for any other suitable number of inputted quantum circuits thereafter.

In various embodiments, the computerized tool can further comprise a genetic component. In various aspects, the genetic component can implement any suitable genetic algorithms so as to combine and/or modify high-value quantum circuits in the parametrized library. For example, after the valuation component computes, via the optimized valuation formula, value scores for one or more inputted quantum circuits, the genetic component can identify quantum circuits that have sufficiently high value scores (e.g., above any suitable thresholds), and can combine and/or modify those two quantum circuits via any suitable genetic and/or evolutionary algorithms, thereby yielding quantum circuits that have even higher value scores.

Various embodiments of the invention can be employed to use hardware and/or software to solve problems that are highly technical in nature (e.g., to facilitate quantum circuit valuation), that are not abstract and that cannot be performed as a set of mental acts by a human. Further, some of the processes performed can be performed by a specialized computer (e.g., accessing, by a device operatively coupled to a processor, a first quantum circuit, appraising, by the device, the first quantum circuit based on one or more factors, thereby yielding a value score that characterizes the first quantum circuit; determining, by the device, that the value score exceeds a threshold; and recommending, by the device, deployment of the first quantum circuit based on the determining). Such defined tasks are not typically performed manually by humans. Moreover, neither the human mind nor a human with pen and paper can electronically access a quantum circuit, electronically generate a value score for the quantum circuit, and/or electronically execute and/or recommend execution of the quantum circuit based on the value score. Instead, various embodiments of the invention are inherently and inextricably tied to computer technology and cannot be implemented outside of a computing environment (e.g., quantum circuits are inherently computerized objects that cannot exist outside of computing systems; likewise, a computerized tool that appraises quantum circuits so that different quantum circuits can be ranked and/or compared against each other is also an inherently computerized device that cannot be practicably implemented in any sensible way without computers).

In various instances, embodiments of the invention can integrate into a practical application the disclosed teachings regarding quantum circuit valuation. Indeed, as described herein, various embodiments of the invention, which can take the form of systems and/or computer-implemented methods, can be considered as a computerized tool that facilitates appraisal of quantum circuits, so that different quantum circuits can be ranked and/or compared against each other (e.g., so that objective triage decision making with respect to quantum circuits can be performed). As explained above, although much quantum research has been dedicated to the design and/or optimization of quantum circuits, no research has been dedicated to the appraisal and/or valuation of quantum circuits. That is, there are no systems and/or techniques in the state of the art that can objectively quantify a level of value, worth, and/or importance of a quantum circuit based on characteristics of the quantum circuit. Accordingly, when quantum researchers desire to prioritize the allocation of limited resources to different quantum circuits (e.g., desire to determine which circuits to execute in a given computing context, desire to determine which circuits to optimize first), the quantum researchers must take wild guesses as to which quantum circuits to prioritize. In stark contrast, embodiments of the invention can facilitate objectively and automatically appraising quantum circuits, so that more valuable quantum circuits can be identified and thus prioritized during limited resource allocation. Specifically, various embodiments of the invention can electronically receive a quantum circuit and/or a computing context (e.g., identifying quantum hardware and/or technical domain) in which it is desired to deploy the quantum circuit. Moreover, various embodiments of the invention can compute various factors (e.g., frequency factor, complexity factor, resource factor, similarity factor)

based on the characteristics of the inputted quantum circuit, based on characteristics of similar quantum circuits, and/or based on the inputted computing context in which it is desired to deploy the inputted quantum circuit. Based on these factors, various embodiments of the invention can compute a value score for the inputted quantum circuit, which represents a level of value, worth, and/or importance of the inputted quantum circuit. Accordingly, different quantum circuits can be assigned different value scores, which allows such different quantum circuits to be ranked according to value score. Various actions can thus be taken based on such ranking (e.g., allocation of limited resources can be prioritized based on value score). Systems and/or techniques that can automatically assign value scores to quantum circuits so as to enable prioritization and/or ranking of quantum circuits clearly constitute a concrete and tangible technical improvement in the field of quantum computing.

Furthermore, various embodiments of the invention can control tangible, hardware-based, and/or software-based devices based on the disclosed teachings. For example, embodiments of the invention can actually execute on tangible quantum hardware (and/or can refrain from executing on tangible quantum hardware) a quantum circuit based on the value score of the quantum circuit.

It should be appreciated that the figures and the herein disclosure describe non-limiting examples of various embodiments of the invention.

FIG. 1 illustrates a block diagram of an example, non-limiting system 100 that can facilitate quantum circuit valuation in accordance with one or more embodiments described herein. As shown, a quantum circuit valuation system 102 can be electronically integrated, via any suitable wired and/or wireless electronic connections, with a quantum circuit 104 and/or a computing context 106. In various aspects, the quantum circuit 104 can be any suitable quantum circuit. That is, the quantum circuit 104 can incorporate any suitable numbers and/or types of quantum gates (e.g., Pauli-X gates, Pauli-Y gates, Pauli-Z gates, Hadamard gates, Phase gates, CNOT gates, Toffoli gates) in any suitable orders and/or configurations. Moreover, the quantum circuit 104 can be configured to operate on any suitable number of qubits.

In various instances, the computing context 106 can be electronic data that indicates a quantum hardware 108 on which it is desired to execute/deploy the quantum circuit 104. In various cases, the quantum hardware 108 can have any suitable number of physical qubits, can incorporate any suitable physical qubit construction (e.g., spin-based qubits, superconducting qubits), and/or can incorporate any suitable physical qubit connectivity, topology, and/or layout (e.g., hex topology, rectilinear topology). In various aspects, the computing context 106 can be electronic data that indicates a technical domain 110 in which it is desired to execute/deploy the quantum circuit 104. In various cases, the technical domain 110 can be any suitable field of use in which it is desired to implement the quantum circuit 104 as a problem-solving tool, such as cybersecurity, financial modeling, computational chemistry, weather forecasting, and/or artificial intelligence.

As explained herein, the quantum circuit valuation system 102 can appraise the quantum circuit 104. In other words, the quantum circuit valuation system 102 can assign to the quantum circuit 104 a value score that characterizes a level of value, worth, and/or importance of the quantum circuit 104, as described below.

In various embodiments, the quantum circuit valuation system 102 can comprise a processor 112 (e.g., computer processing unit, microprocessor) and a computer-readable memory 114 that is operably connected to the processor 112. The memory 114 can store computer-executable instructions which, upon execution by the processor 112, can cause the processor 112 and/or other components of the quantum circuit valuation system 102 (e.g., input component 116, library component 118, valuation component 120, execution component 122) to perform one or more acts. In various embodiments, the memory 114 can store computer-executable components (e.g., input component 116, library component 118, valuation component 120, execution component 122), and the processor 112 can execute the computer-executable components.

In various embodiments, the quantum circuit valuation system 102 can comprise an input component 116. In various aspects, the input component 116 can electronically retrieve and/or otherwise electronically access the quantum circuit 104 and/or the computing context 106 from any suitable centralized and/or decentralized data structure (not shown), whether remote from and/or local to the input component 116.

In various embodiments, the quantum circuit valuation system 102 can comprise a library component 118. In various aspects, the library component 118 can electronically compile and/or otherwise electronically store a parametrized circuit library, which contains and/or represents any suitable number of existing quantum circuits. In various instances, quantum circuits can be represented in the parametrized circuit library by parameter tuples, where a parameter tuple can be considered as a vector. As mentioned above, any suitable number and/or types of parameters can be used to define and/or represent circuits in the parametrized circuit library. For example, such parameters can include total gate count, granular gate counts (e.g., CNOT gate count, Hadamard gate count, Toffoli gate count), circuit depth, circuit width, outputted quantum states, execution time, number of executions, and/or technical domain.

In various cases, the library component 118 can electronically generate a parameter tuple that represents the quantum circuit 104. In various aspects, the library component 118 can electronically identify n nearest neighbors of the quantum circuit 104, by computing similarity scores between the parameter tuple of the quantum circuit 104 and other parameter tuples in the parametrized circuit library. As mentioned above, because parameter tuples can be considered as vectors, the library component 118 can compute a Euclidean distance and/or an angle separating any two parameter tuples. Accordingly, a similarity score between the two parameter tuples can be generated as a function of such computed Euclidean distance and/or angle. In various instances, the library component 118 can compute a similarity score between the quantum circuit 104 and every other (and/or fewer than every other) circuit that is represented in the parametrized circuit library. In various cases, the library component 118 can rank such computed similarity scores in order of ascending and/or descending similarity, and the library component 118 can identify the n quantum circuits that are most similar to the quantum circuit 104, for any suitable positive integer n. These n quantum circuits can be referred to as the n nearest neighbors of the quantum circuit 104.

In various embodiments, the quantum circuit valuation system 102 can comprise a valuation component 120. In various aspects, the valuation component 120 can assign a value score to the quantum circuit 104 based on various factors as described herein. In some cases, such factors can include a frequency factor. In various instances, the valuation component 120 can compute the frequency factor based on how often the n nearest neighbors have been executed/deployed in some past time interval (e.g., in the past 24 hours, in the past week, in the past month, in the past six months, in the past year). More specifically, as explained herein, the library component 118 can identify the n quantum circuits in the parametrized circuit library that are most similar to the quantum circuit 104. Because the parametrized circuit library can, in some cases, track the number of executions/deployments of a quantum circuit, the numbers of executions/deployments of the n nearest neighbors can be known. Accordingly, the frequency factor can be a scalar whose magnitude depends upon the numbers of executions/deployments of the n nearest neighbors. For example, in some cases, the magnitude of the frequency factor can be equal to the average number of executions/deployments of the n nearest neighbors (e.g., the numbers of executions can be summed and divided by n). As another example, in some cases, the magnitude of the frequency factor can be equal to the weighted average number of executions/deployments of the n nearest neighbors, where similarity score is used as a weight (e.g., such that the number of executions/deployments of a more similar circuit are counted more heavily than the number of executions/deployments of a less similar circuit). As yet another example, in some cases, the magnitude of the frequency factor can be equal to any suitable linear combination and/or multiplicative combination of the numbers of executions of the n nearest neighbors. In still another example, in some cases, the magnitude of the frequency factor can be normalized (e.g., via a tunable sigmoid function, via a softmax function) to be between any suitable interval (e.g., between 0 and 1). In any case, the frequency factor can represent and/or indicate how often the n nearest neighbors are executed/deployed, such that a higher frequency factor indicates that the n nearest neighbors have been executed/deployed more often.

In various embodiments, such factors can include a complexity factor. In various instances, the valuation component 120 can compute the complexity factor based on a structure of the quantum circuit 104. More specifically, as explained herein, the quantum circuit 104 can incorporate any suitable numbers and/or types of quantum gates in any suitable order and/or configuration. Accordingly, the complexity factor can be a scalar whose magnitude depends upon the quantum gates implemented by the quantum circuit 104. For example, in some cases, the magnitude of the complexity factor can be equal to any suitable linear combination and/or multiplicative combination of the total gate count of the quantum circuit 104, one or more granular gate counts of the quantum circuit 104, a circuit depth of the quantum circuit 104, and/or a circuit width of the quantum circuit 104. As another example, in some cases, the magnitude of the complexity factor can be normalized (e.g., via a tunable sigmoid function, via a softmax function) to be between any suitable interval (e.g., between 0 and 1). In any case, the complexity factor can represent and/or indicate how complex the structure of the quantum circuit 104 is, such that a higher complexity factor indicates that the quantum circuit 104 is more complex (e.g., has more total gates, has more entangling gates, has a larger circuit depth, incorporates more qubits).

In various embodiments, such factors can include a resource factor. In various instances, the valuation component 120 can compute the resource factor based on amounts of pre-processing and/or post-processing which the quantum circuit 104 would require to be executable on the quantum hardware 108. As mentioned above, different quantum circuits can have different quantum hardware requirements. Specifically, some quantum gates can only be executed on certain physical qubit constructions, some quantum circuits can only be executed on hardware that exhibits a certain qubit topology, some quantum circuits can require special formatting and/or preparation of initial quantum states, some quantum circuits can require gate transpiling in order to be executed on particular hardware, and/or some quantum circuits can require extensive error correction depending upon the underlying hardware. Accordingly, the resource factor can be a scalar whose magnitude depends upon an amount of pre-processing (e.g., gate transpiling, initial state formatting) and/or post-processing (e.g., error correction) which the quantum circuit 104 would have to undergo in order to be executable on the quantum hardware 108. For example, in some cases, the magnitude of the resource factor can be equal to any suitable linear combination and/or multiplicative combination of the amount of pre-processing and/or the amount of post-processing (e.g., in some cases, the reciprocal of the amount of pre-processing and/or the reciprocal of the amount of post-processing can be implemented). As another example, in some cases, the magnitude of the resource factor can be normalized (e.g., via a tunable sigmoid function, via a softmax function) to be between any suitable interval (e.g., between 0 and 1). In any case, the resource factor can represent and/or indicate how much pre-processing and/or post-processing the quantum circuit 104 would need if executed on the quantum hardware 108, such that a higher resource factor indicates that the quantum circuit 104 would require less pre-processing and/or post-processing to be executable on the quantum hardware 108. Those having ordinary skill in the art will appreciate that any suitable units of measurement can be used to measure and/or otherwise quantify an amount of pre-processing and/or an amount of post-processing (e.g., can be based on number of gates that need to be transpiled and/or converted, can be based on number of gates in a required error correcting code).

In various embodiments, such factors can include a similarity factor. In various instances, the valuation component 120 can compute the similarity factor based on how similar the quantum circuit 104 is to other quantum circuits that are known to be effective in the technical domain 110. More specifically, as explained herein, one of the parameters of the parametrized circuit library of the library component 118 can be technical domain (e.g., field of use in which a given quantum circuit is known to be implemented and/or effective). Thus, the library component 118 can, in some cases, cluster the parametrized circuit library according to technical domain, and the library component 118 can consider the similarity scores between the quantum circuit 104 and the quantum circuits that are known to be associated with the technical domain 110. Accordingly, the similarity factor can be a scalar whose magnitude depends upon the similarity scores between the quantum circuit 104 and the quantum circuits that are known to be associated with the technical domain 110. For example, in some cases, the magnitude of the similarity factor can be equal to the average of the similarity scores of the quantum circuits that are known to be associated with the technical domain 110. As another example, in some cases, the magnitude of the similarity factor can be equal to any suitable linear combination and/or multiplicative combination of the similarity scores of the quantum circuits that are known to be associated with the technical domain 110. In still another example, in some cases, the magnitude of the similarity factor can be normalized (e.g., via a tunable sigmoid function, via a softmax function) to be between any suitable interval (e.g., between 0 and 1). In any case, the similarity factor can represent and/or indicate how similar the quantum circuit 104 is to quantum circuits that are known to be associated with the technical domain 110, such that a higher similarity factor indicates that the quantum circuit 104 is more similar to the quantum circuits known to be associated with the technical domain 110.

In various embodiments, the valuation component 120 can aggregate and/or combine, via any suitable mathematical techniques, the frequency factor, the complexity factor, the resource factor, and/or the similarity factor, thereby yielding a value score. In various cases, the value score can be a scalar that represents a level of value, worth, and/or importance of the quantum circuit 104. As explained herein, the valuation component 120 can utilize any suitable valuation formula to combine and/or aggregate the frequency factor, the complexity factor, the resource factor, and/or the similarity factor. For example, in some cases, the valuation formula can be any suitable linear combination of the frequency factor, the complexity factor, the resource factor, and/or the similarity factor. As another example, in some cases, the valuation formula can be any suitable multiplicative combination of the frequency factor, the complexity factor, the resource factor, and/or the similarity factor. In any case, the value score can represent and/or indicate how valuable and/or important the quantum circuit 104 is, such that a higher value score indicates more value and/or importance.

In various embodiments, the execution component 122 can electronically compare the value score computed by the valuation component 120 to any suitable threshold, and can take any suitable electronic action based on the comparison. For example, in some cases, the execution component 122 can actually execute and/or cause to be executed the quantum circuit 104 on the quantum hardware 108 based on determining that the value score exceeds the threshold (e.g., the execution component 122 can transmit an execution command to the quantum hardware 108 if the value score exceeds the threshold). Conversely, the execution component 122 can refrain from executing the quantum circuit 104 on the quantum hardware 108 based on determining that the value score fails to exceed the threshold (e.g., the execution component 122 can transmit a do-not-execute command to the quantum hardware 108 if the value score does not exceed the threshold). As another example, in some cases, the execution component 122 can recommend execution of the quantum circuit 104 in the technical domain 110 based on determining that the value score exceeds the threshold (e.g., the execution component 122 can transmit an electronic message that indicates such recommendation if the value score exceeds the threshold). Conversely, the execution component 122 can recommend against executing the quantum circuit 104 in the technical domain 110 based on determining that the value score fails to exceed the threshold (e.g., the execution component 122 can transmit an electronic message that indicates such recommendation if the value score does not exceed the threshold).

Figure 2:
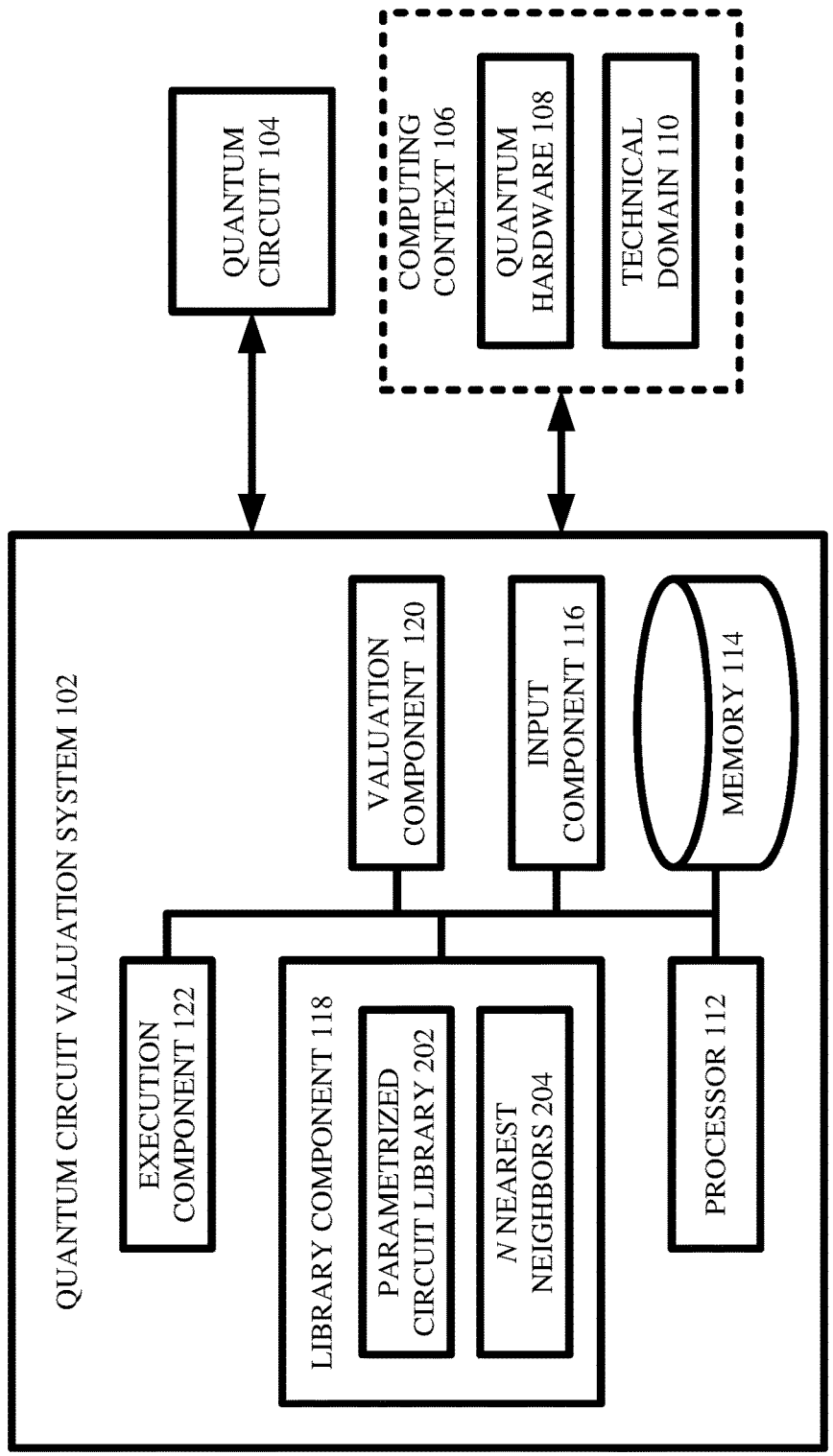
FIG. 2 illustrates a block diagram of an example, non-limiting system including a parametrized circuit library that facilitates quantum circuit valuation in accordance with one or more embodiments described herein.

FIG. 2 illustrates a block diagram of an example, non-limiting system 200 including a parametrized circuit library that can facilitate quantum circuit valuation in accordance with one or more embodiments described herein. As shown, the system 200 can, in some cases, comprise the same components as the system 100, and can further comprise a parametrized circuit library 202.

In various embodiments, as mentioned above, the library component 118 can electronically store, maintain, access, and/or otherwise compile a parametrized circuit library 202. In various cases, the parametrized circuit library 202 can contain and/or list parameter tuples that represent existing quantum circuits. As explained above, a parameter tuple can be considered as a vector which defines the characteristics of a quantum circuit in the parametrized circuit library 202. In various cases, any suitable parameters can be used to define circuits in the parametrized circuit library 202, such as total gate count, granular gate counts (e.g., CNOT gate count, SWAP gate count, Phase gate count), circuit depth, circuit width, resultant quantum states, number of previous executions/deployments, execution time, and/or technical domain.

Figure 3:
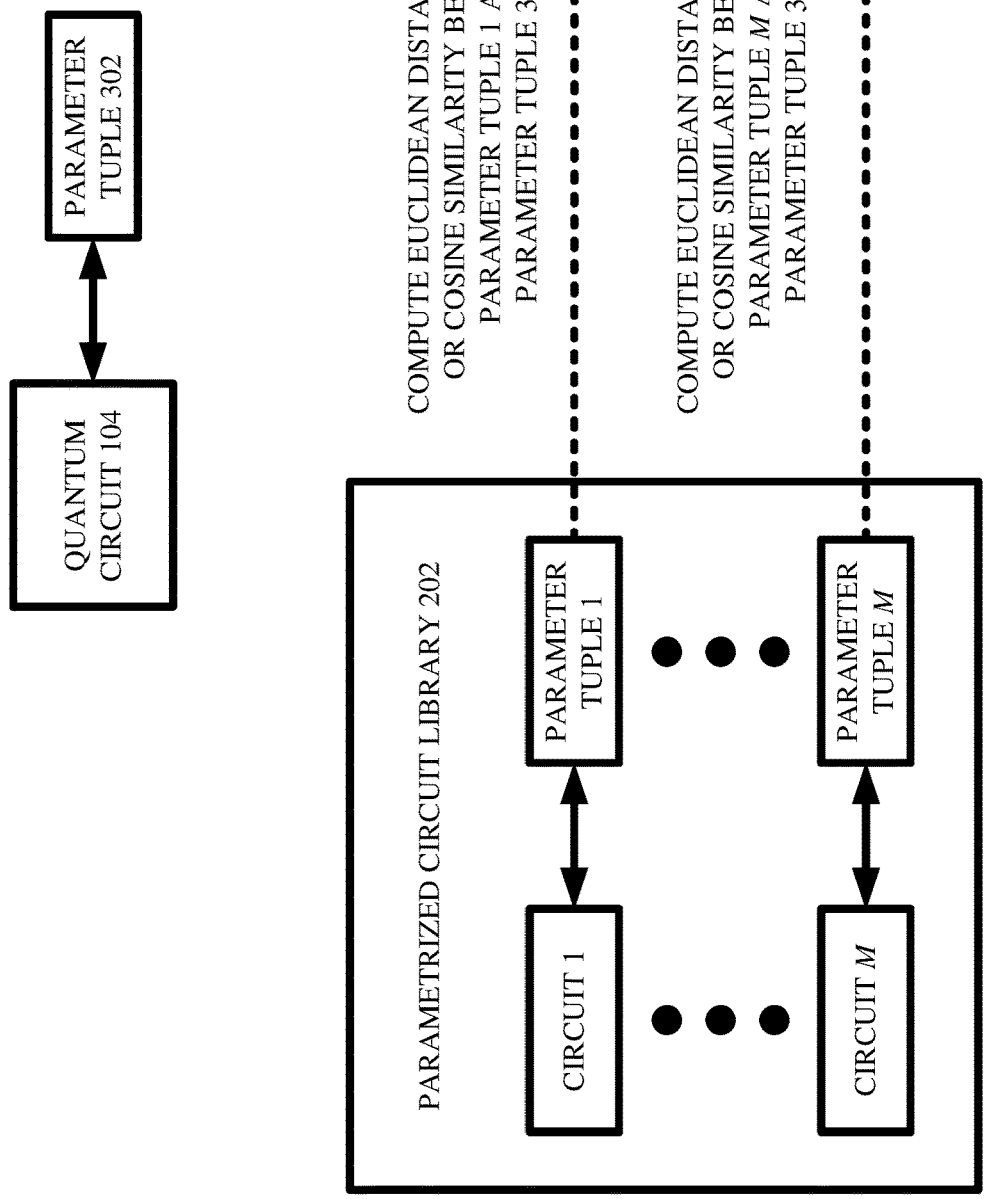
FIG. 3 illustrates a block diagram of an example, non-limiting parametrized circuit library in accordance with one or more embodiments described herein.

In various embodiments, as mentioned above, the library component 118 can identify n quantum circuits in the parametrized circuit library 202 that are most similar to the quantum circuit 104, for any suitable positive integer n. These n quantum circuits can be considered as the n nearest neighbors 204. FIG. 3 illustrates, in an example and non-limiting way, how the library component 118 can identify the n nearest neighbors 204.

As shown in FIG. 3, the quantum circuit 104 can be represented by a parameter tuple 302. In some cases, the library component 118 can generate the parameter tuple 302 based on characteristics of the quantum circuit 104. In other cases, the library component 118 can retrieve the parameter tuple 302 from any suitable data structure (not shown). In various cases, the parametrized circuit library 202 can comprise m existing quantum circuits (e.g., circuit 1 to circuit m), for any suitable positive integer m≥n. Although FIG. 3 does not depict the quantum circuit 104 as being within the parametrized circuit library 202, those having ordinary skill in the art will appreciate that the library component 118 can insert the quantum circuit 104 into the parametrized circuit library 202, such that the parametrized circuit library 202 now contains and/or lists m+1 quantum circuits. As shown, each of the circuits in the parametrized circuit library 202 can be represented by a corresponding parameter tuple (e.g., the circuit 1 can be represented by the parameter tuple 1, the circuit m can be represented by the parameter tuple m).

In various aspects, the library component 118 can compute similarity scores between any two parameter tuples based on a Euclidean distance and/or a cosine similarity between those two parameter tuples. For instance, as shown, the library component 118 can compute a Euclidean distance and/or a cosine similarity between the parameter tuple 1 and the parameter tuple 302, and the library component 118 can generate a similarity score 1 based on such Euclidean distance and/or cosine similarity, where the similarity score 1 represents how similar the circuit 1 is to the quantum circuit 104. Likewise, as shown, the library component 118 can compute a Euclidean distance and/or a cosine similarity between the parameter tuple m and the parameter tuple 302, and the library component 118 can generate a similarity score m based on such Euclidean distance and/or cosine similarity, where the similarity score m represents how similar the circuit m is to the quantum circuit 104. Those having ordinary skill in the art will appreciate that the similarity score 1 can be any suitable function of the Euclidean distance and/or cosine similarity between the parameter tuple 1 and the parameter tuple 302. Likewise, those having ordinary skill in the art will appreciate that the similarity score m can be any suitable function of the Euclidean distance and/or cosine similarity between the parameter tuple m and the parameter tuple 302. Accordingly, by analyzing the similarity score 1 to the similarity score m, the library component 118 can identify the n quantum circuits that are most similar to the quantum circuit 104, and these n quantum circuits can be considered as the n nearest neighbors 204.

In various alternative embodiments, the library component 118 can identify the n nearest neighbors 204 by implementing any suitable clustering algorithm and/or clustering technique (e.g., hierarchical clustering) so as to cluster/group similar quantum circuits in the parametrized circuit library 202 together. In such case, the cluster in which the quantum circuit 104 is placed can be considered as the n nearest neighbors 204. In other embodiments, any other suitable mathematical, statistical, and/or computational technique for grouping similar quantum circuits together can be implemented.

In some cases, if the parametrized circuit library 202 represents circuits according to resultant quantum states, similarity scores can be computed by calculating an overlap and/or fidelity between quantum states.

Figure 4:
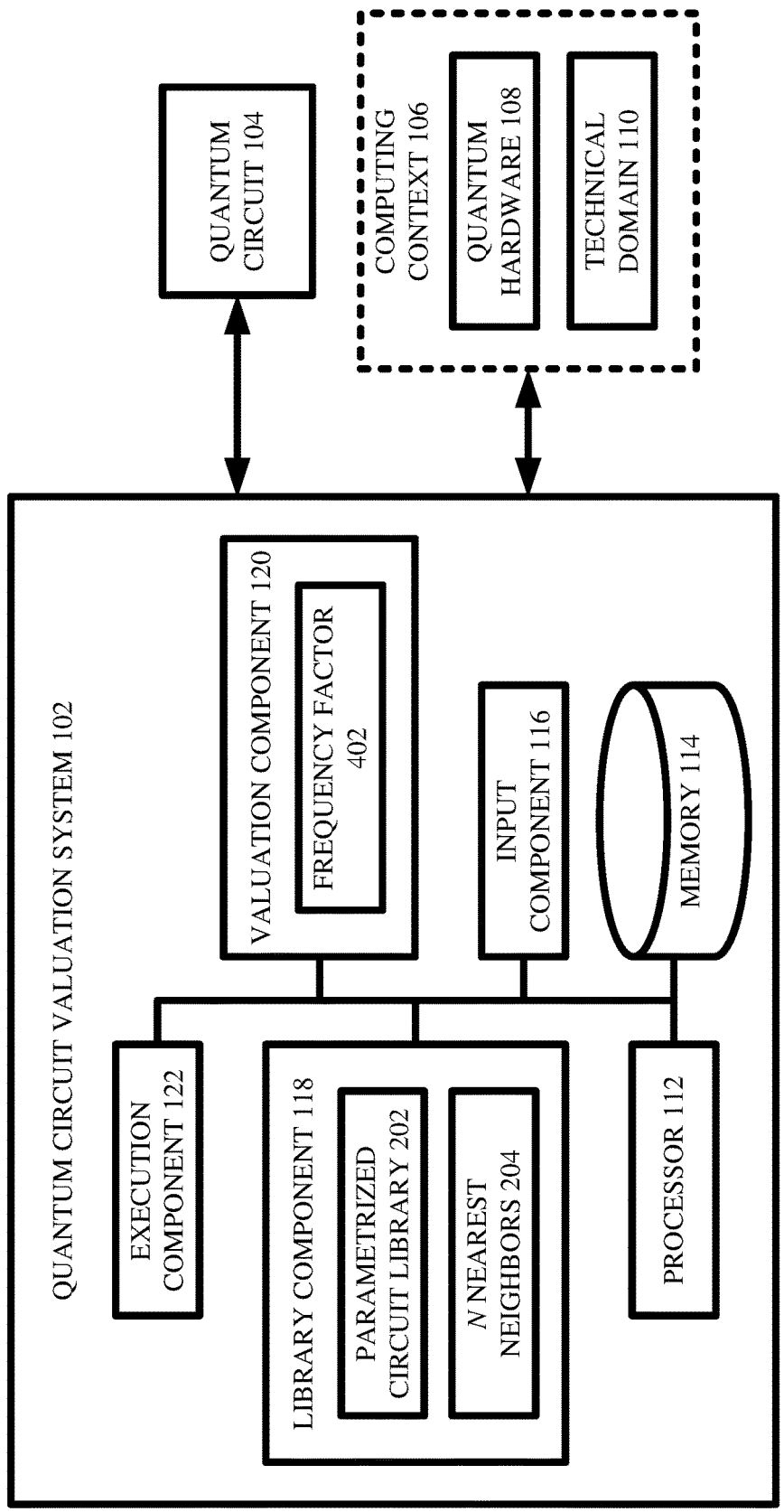
FIG. 4 illustrates a block diagram of an example, non-limiting system including a frequency factor that facilitates quantum circuit valuation in accordance with one or more embodiments described herein.

FIG. 4 illustrates a block diagram of an example, non-limiting system 400 including a frequency factor that can facilitate quantum circuit valuation in accordance with one or more embodiments described herein. As shown, the system 400 can, in some cases, comprise the same components as the system 200, and can further comprise a frequency factor 402.

Figure 5:
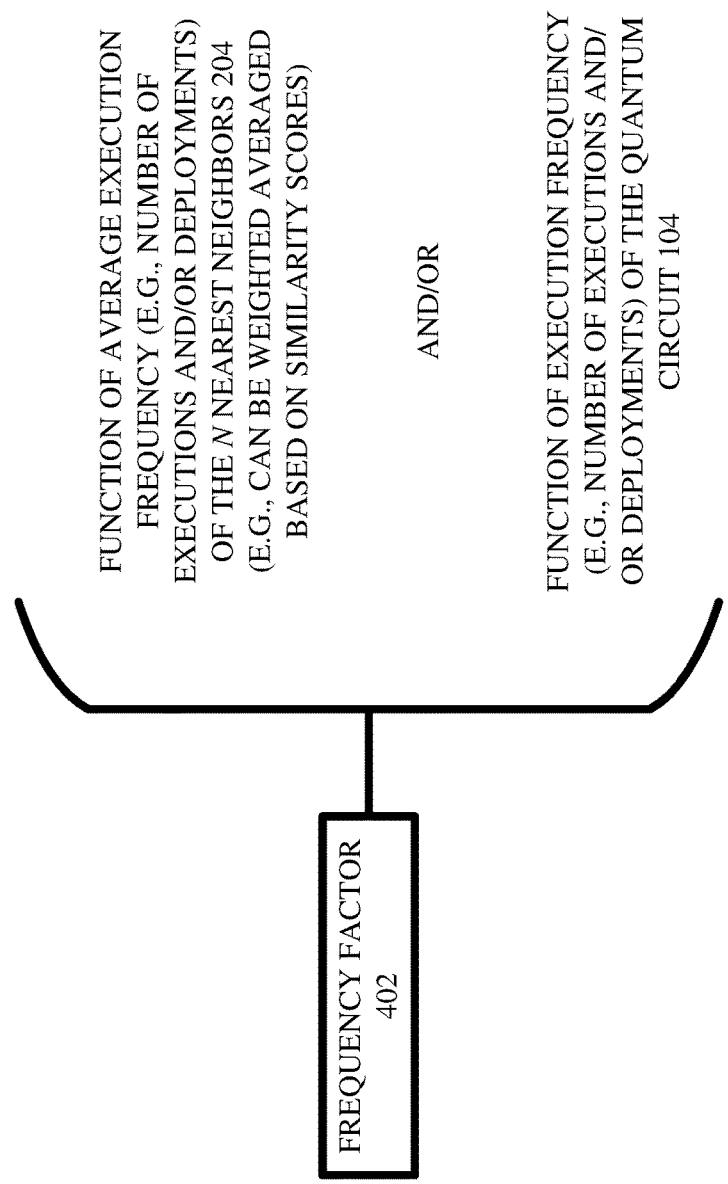
FIG. 5 illustrates a diagram of an example, non-limiting frequency factor in accordance with one or more embodiments described herein.

In various embodiments, as mentioned above, the valuation component 120 can compute the frequency factor 402 based on the n nearest neighbors 204. More specifically, and as shown in FIG. 5, the frequency factor 402 can be a scalar whose magnitude is a function of the average execution frequency of the n nearest neighbors 204 (e.g., the average number of past executions/deployments of the n nearest neighbors 204) and/or of the execution frequency of the quantum circuit 104 (e.g., the number of past executions/deployments of the quantum circuit 104). In some cases, the quantum circuit 104 can be a newly-designed circuit that has not yet been executed/deployed, which means that the execution frequency of the quantum circuit 104 would be zero. In such case, the frequency factor 402 can be a function of just the average execution frequency of the n nearest neighbors 204.

Those having ordinary skill in the art will appreciate that the frequency factor 402 can have any suitable magnitude and/or can otherwise be any suitable function of the numbers of executions/deployments of the n nearest neighbors 204 and/or of the number of executions/deployments of the quantum circuit 104. For instance, in some cases, the magnitude of the frequency factor 402 can be equal to the average number of executions/deployments of the n nearest neighbors 204 and/or of the quantum circuit 104. In other cases, the magnitude of the frequency factor 402 can be equal to any other suitable linear combination and/or multiplicative combination of the numbers of executions/deployments of the n nearest neighbors 204 and/or of the quantum circuit 104. In still other cases, the magnitude of the frequency factor 402 can be normalized, such as by applying a tuned sigmoid function to a linear combination and/or a multiplicative combination of the numbers of executions/deployments of the n nearest neighbors 204 and/or of the quantum circuit 104. In any case, the frequency factor 402 can be defined in any suitable way so that its magnitude represents how often the quantum circuit 104 and/or the n nearest neighbors 204 have been executed. In this way, if the quantum circuit 104 and/or the circuits that are similar to the quantum circuit 104 are popular (e.g., frequently executed/deployed), the frequency factor 402 can have a large magnitude, whereas if the quantum circuit 104 and/or the circuits that are similar to the quantum circuit 104 are unpopular, the frequency factor 402 can have a low magnitude.

Figure 6:
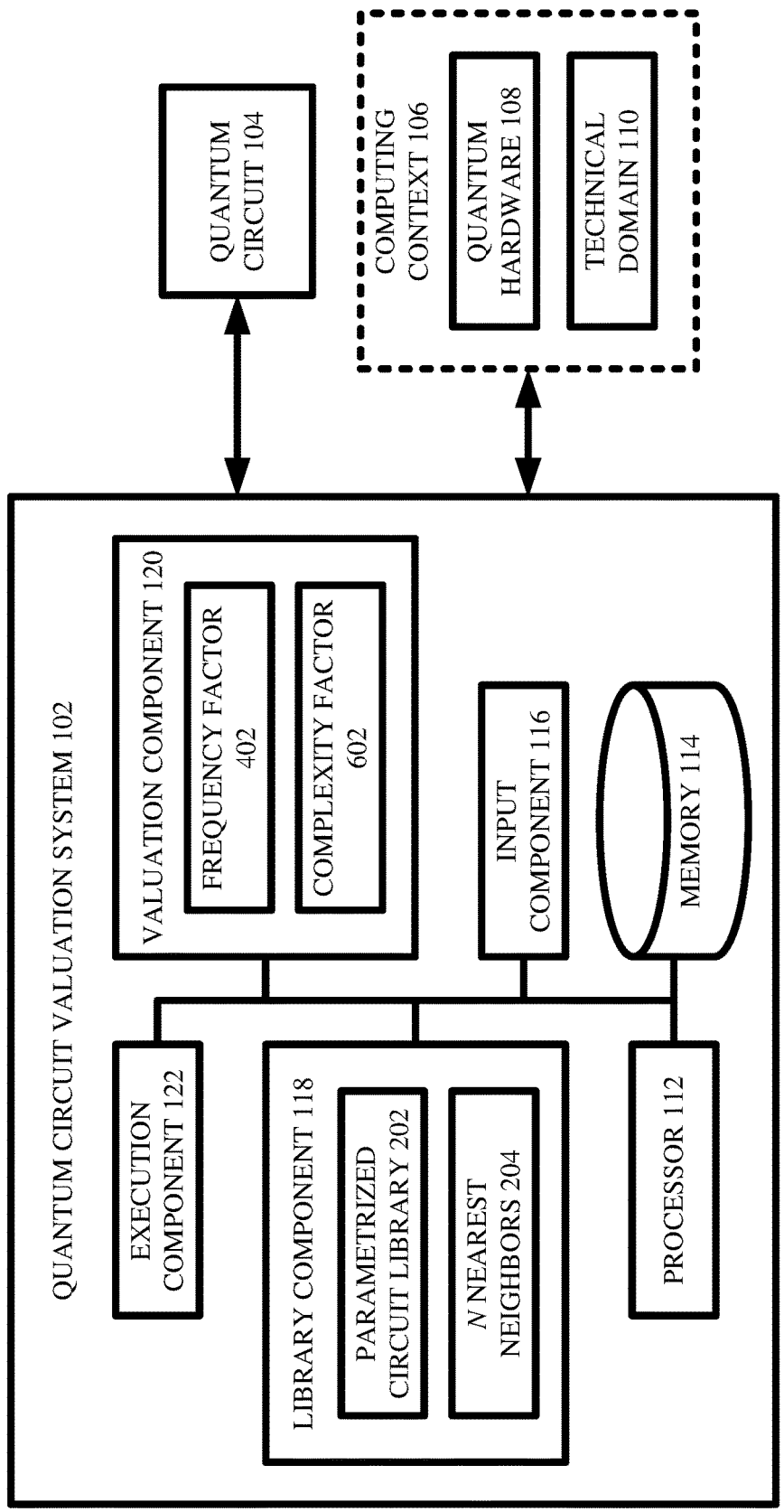
FIG. 6 illustrates a block diagram of an example, non-limiting system including a complexity factor that facilitates quantum circuit valuation in accordance with one or more embodiments described herein.

FIG. 6 illustrates a block diagram of an example, non-limiting system 600 including a complexity factor that can facilitate quantum circuit valuation in accordance with one or more embodiments described herein. As shown, the system 600 can, in some cases, comprise the same components as the system 400, and can further comprise a complexity factor 602.

Figure 7:
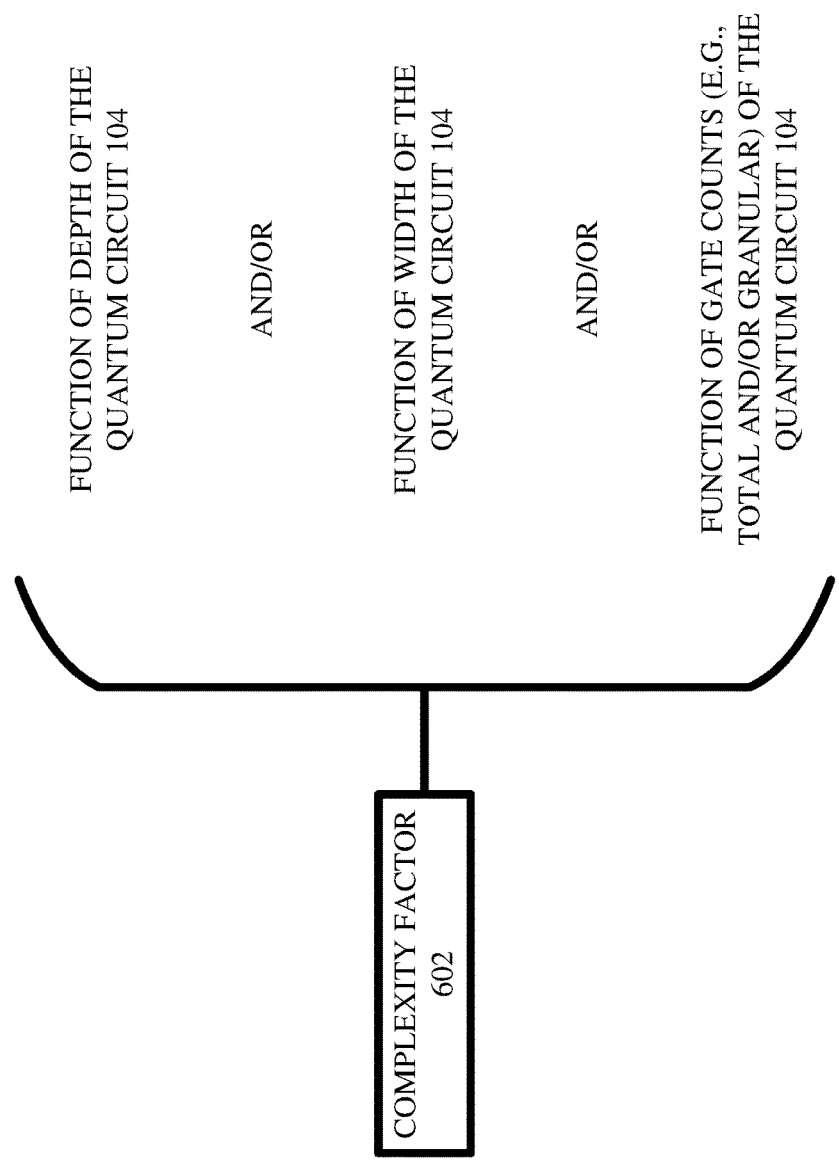
FIG. 7 illustrates a diagram of an example, non-limiting complexity factor in accordance with one or more embodiments described herein.

In various embodiments, as mentioned above, the valuation component 120 can compute the complexity factor 602 based on the structure of the quantum circuit 104. More specifically, and as shown in FIG. 7, the complexity factor 602 can be a scalar whose magnitude is a function of the depth of the quantum circuit 104, the width of the quantum circuit 104, the total gate count of the quantum circuit 104, and/or one or more granular gate counts of the quantum circuit 104.

Those having ordinary skill in the art will appreciate that the complexity factor 602 can have any suitable magnitude and/or can otherwise be any suitable function of the circuit depth, circuit width, total gate count, and/or one or more granular gate counts of the quantum circuit 104. For instance, in some cases, the magnitude of the complexity factor 602 can be equal to any suitable linear combination and/or multiplicative combination of the circuit depth, circuit width, the total gate count, and/or one or more granular gate counts of the quantum circuit 104. In other cases, the magnitude of the complexity factor 602 can be normalized, such as by applying a tuned sigmoid function to a linear combination and/or a multiplicative combination of the circuit depth, the circuit width, the total gate count, and/or one or more granular gate counts of the quantum circuit 104. In any case, the complexity factor 602 can be defined in any suitable way so that its magnitude represents how complicated the structure of the quantum circuit 104 is. In this way, if the quantum circuit 104 has a very simple structure (e.g., small circuit depth, small circuit width, low gate counts), the complexity factor 602 can have a low magnitude, whereas if the quantum circuit 104 has a very complicated structure (e.g., large circuit depth, large circuit width, high gate counts), the complexity factor 602 can have a large magnitude.

Figure 8:
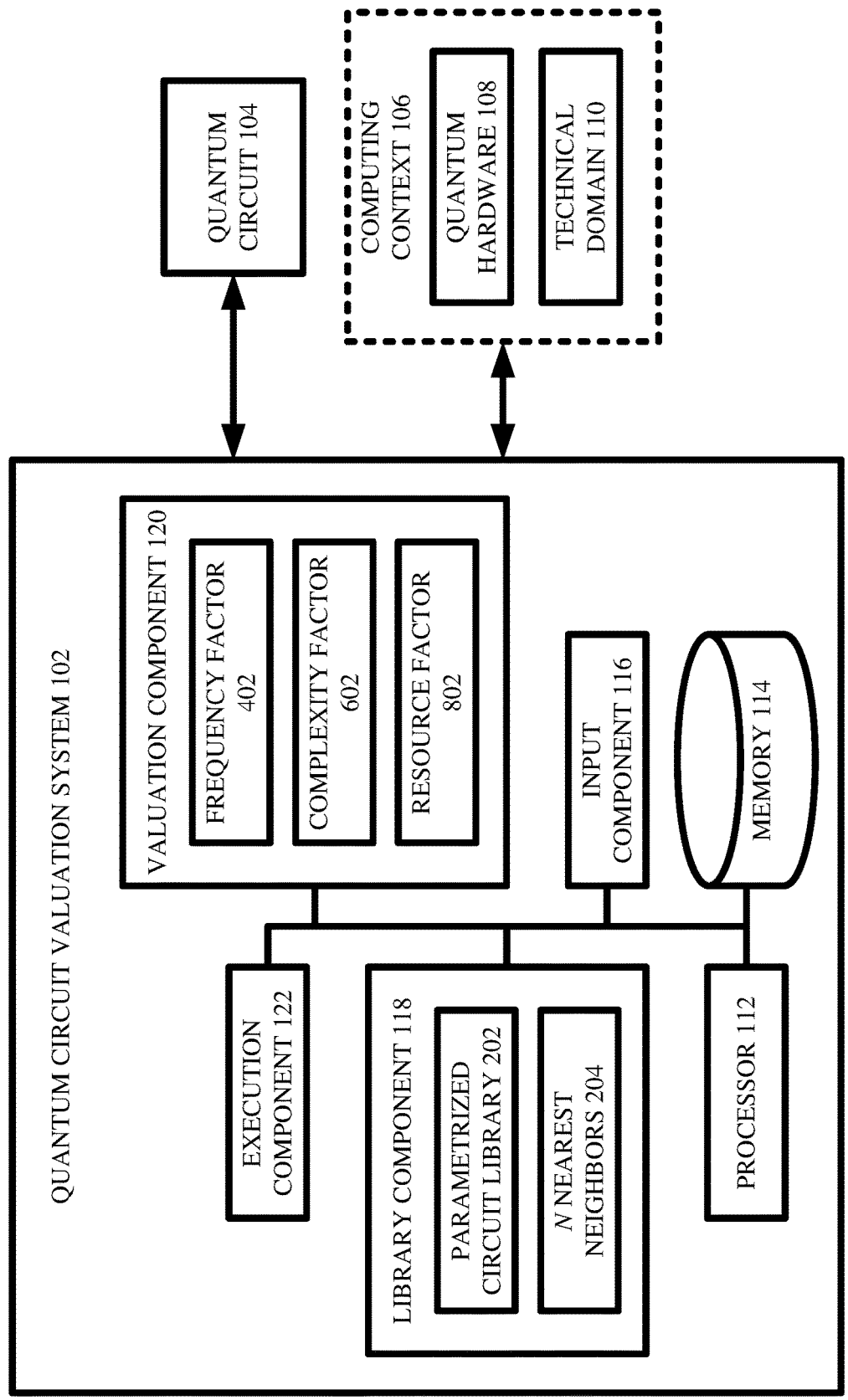
FIG. 8 illustrates a block diagram of an example, non-limiting system including a resource factor that facilitates quantum circuit valuation in accordance with one or more embodiments described herein.

FIG. 8 illustrates a block diagram of an example, non-limiting system 800 including a resource factor that can facilitate quantum circuit valuation in accordance with one or more embodiments described herein. As shown, the system 800 can, in some cases, comprise the same components as the system 600, and can further comprise a resource factor 802.

Figure 9:
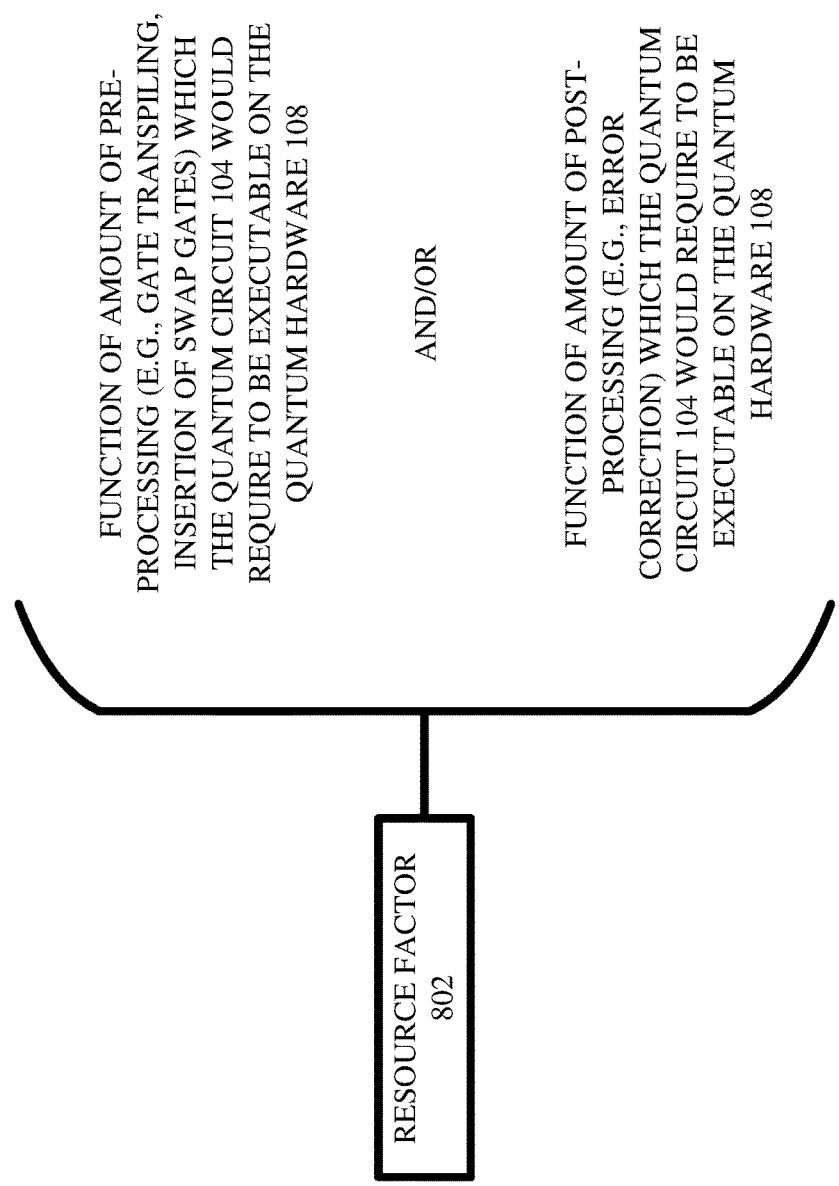
FIG. 9 illustrates a diagram of an example, non-limiting resource factor in accordance with one or more embodiments described herein.

In various embodiments, as mentioned above, the valuation component 120 can compute the resource factor 802 based on the amount of preparation and/or resource expenditure which the quantum circuit 104 would require if the quantum circuit 104 were executed on the quantum hardware 108. More specifically, and as shown in FIG. 9, the resource factor 802 can be a scalar whose magnitude is a function of an amount of pre-processing (e.g., gate transpiling, insertion of SWAP gates, quantum state formatting/initialization) and/or an amount of post-processing (e.g., application of error correction codes) which would have to be implemented in order to properly execute the quantum circuit 104 on the quantum hardware 108.

Those having ordinary skill in the art will appreciate that the resource factor 802 can have any suitable magnitude and/or can otherwise be any suitable function of the amount pre-processing and/or post-processing which the quantum circuit 104 would have to undergo if it were executed on the quantum hardware 108. For instance, in some cases, the magnitude of the resource factor 802 can be equal to any suitable linear combination and/or multiplicative combination of such amounts of pre-processing and/or post-processing. In other cases, the magnitude of the resource factor 802 can be normalized, such as by applying a tuned sigmoid function to a linear combination and/or a multiplicative combination of such amounts of pre-processing and/or post-processing. In any case, the resource factor 802 can be defined in any suitable way so that its magnitude represents how many additional resources and/or how much additional attention will have to be expended on quantum circuit 104 in order to practicably execute the quantum circuit 104 on the quantum hardware 108. In this way, if the quantum circuit 104 requires no and/or little pre-processing and/or post-processing to run on the quantum hardware 108 (e.g., if no/little gate transpiling is required, if no/little initial data formatting is required, if no/little error correction is required), the resource factor 802 can have a high magnitude, whereas if the quantum circuit 104 requires much pre-processing and/or post-processing to run on the quantum hardware 108 (e.g., if much gate transpiling is required, if much initial data formatting is required, if much error correction is required), the resource factor 802 can have a small magnitude.

As those having ordinary skill in the art will appreciate, the resource factor 802 can vary with the quantum hardware 108 (e.g., the quantum circuit 104 can be executed with no/little pre-processing and/or post-processing on some quantum hardware, and/or the quantum circuit 104 can be executed only with a lot of pre-processing and/or post-processing on other quantum hardware). Those having ordinary skill in the art will appreciate what is considered much and/or little pre-processing and/or post-processing (e.g., extensive versus non-extensive gate transpiling; extensive versus non-extensive error correction).

Figure 10:
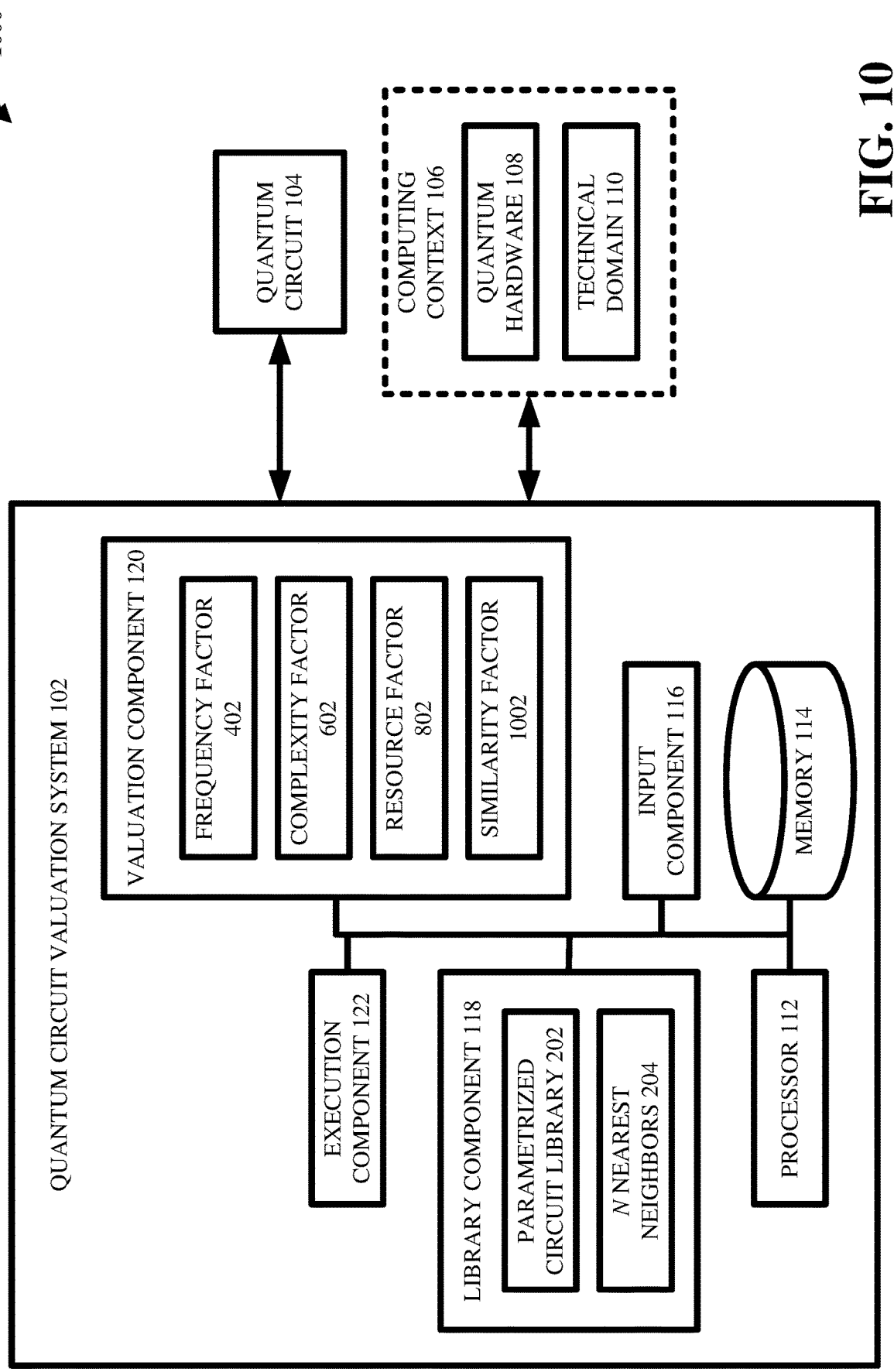
FIG. 10 illustrates a block diagram of an example, non-limiting system including a similarity factor that facilitates quantum circuit valuation in accordance with one or more embodiments described herein.

FIG. 10 illustrates a block diagram of an example, non-limiting system 1000 including a similarity factor that can facilitate quantum circuit valuation in accordance with one or more embodiments described herein. As shown, the system 1000 can, in some cases, comprise the same components as the system 800, and can further comprise a similarity factor 1002.

Figure 11:
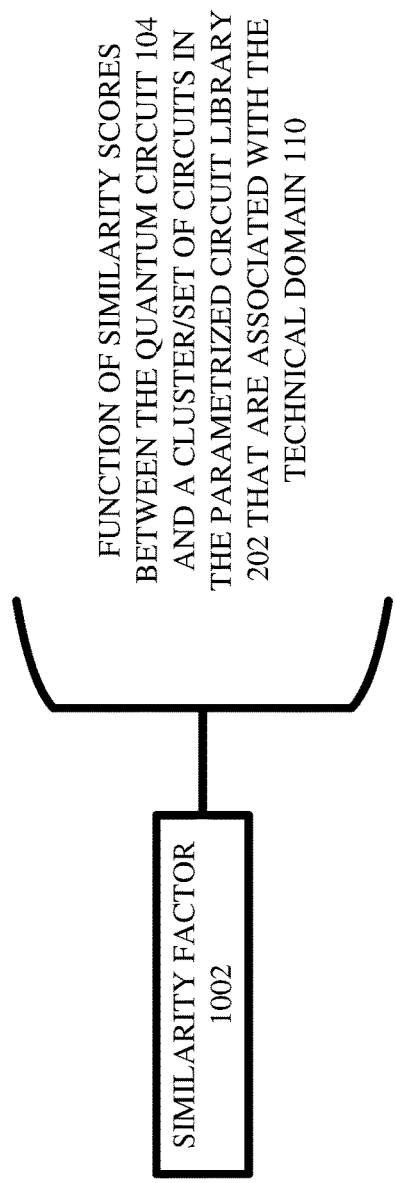
FIG. 11 illustrates a diagram of an example, non-limiting similarity factor in accordance with one or more embodiments described herein.

In various embodiments, as mentioned above, the valuation component 120 can compute the similarity factor 1002 based on how similar the quantum circuit 104 is to other circuits that are known to be effective in and/or associated with the technical domain 110. More specifically, and as shown in FIG. 11, the similarity factor 1002 can be a scalar whose magnitude is a function of similarity scores between the quantum circuit 104 and a cluster and/or set of circuits in the parametrized circuit library 202 that are known to be associated with the technical domain 110. In various cases, as mentioned above, the parametrized circuit library 202 can note, record, and/or track the technical domain (e.g., field of use) of various quantum circuits. Accordingly, the library component 118 can, in some cases, identify one or more quantum circuits in the parametrized circuit library 202 that are known to be associated with the technical domain 110, and the library component 118 can compute similarity scores between such quantum circuits and the quantum circuit 104. In various cases, the similarity factor 1002 can be a function of such similarity scores.

Those having ordinary skill in the art will appreciate that the similarity factor 1002 can have any suitable magnitude and/or can otherwise be any suitable function of the similarity scores between the quantum circuit 104 and the quantum circuits that are known to be associated with the technical domain 110. For instance, in some cases, the magnitude of the similarity factor 1002 can be equal to the average of the similarity scores between the quantum circuit 104 and the quantum circuits that are known to be associated with the technical domain 110. In other cases, the magnitude of the similarity factor 1002 can be equal to any suitable linear combination and/or multiplicative combination of such similarity scores. In still other cases, the magnitude of the similarity factor 1002 can be normalized, such as by applying a tuned sigmoid function to a linear combination and/or a multiplicative combination of such similarity scores. In any case, the similarity factor 1002 can be defined in any suitable way so that its magnitude represents how similar the quantum circuit 104 is to other quantum circuits that are known to be associated with and/or implemented in the technical domain 110. In this way, if the quantum circuit 104 is very similar to other quantum circuits that are already used and/or implemented in the technical domain 110, the similarity factor 1002 can have a high magnitude, whereas if the quantum circuit 104 is very different from other quantum circuits that are already used and/or implemented in the technical domain 110, the similarity factor 1002 can have a small magnitude.

As those having ordinary skill in the art will appreciate, the similarity factor 1002 can vary with the technical domain 110. For example, if it is desired to execute the quantum circuit 104 in the technical domain of weather forecasting, and if the quantum circuit 104 is similar to other circuits that are already implemented in the technical domain of weather forecasting, the similarity factor 1002 can be high. On the other hand, if it is desired to execute the quantum circuit 104 in the technical domain of cryptography, and if the quantum circuit 104 is not similar to other circuits that are already implemented in the technical domain of cryptography, the similarity factor 1002 can be low.

Figure 12:
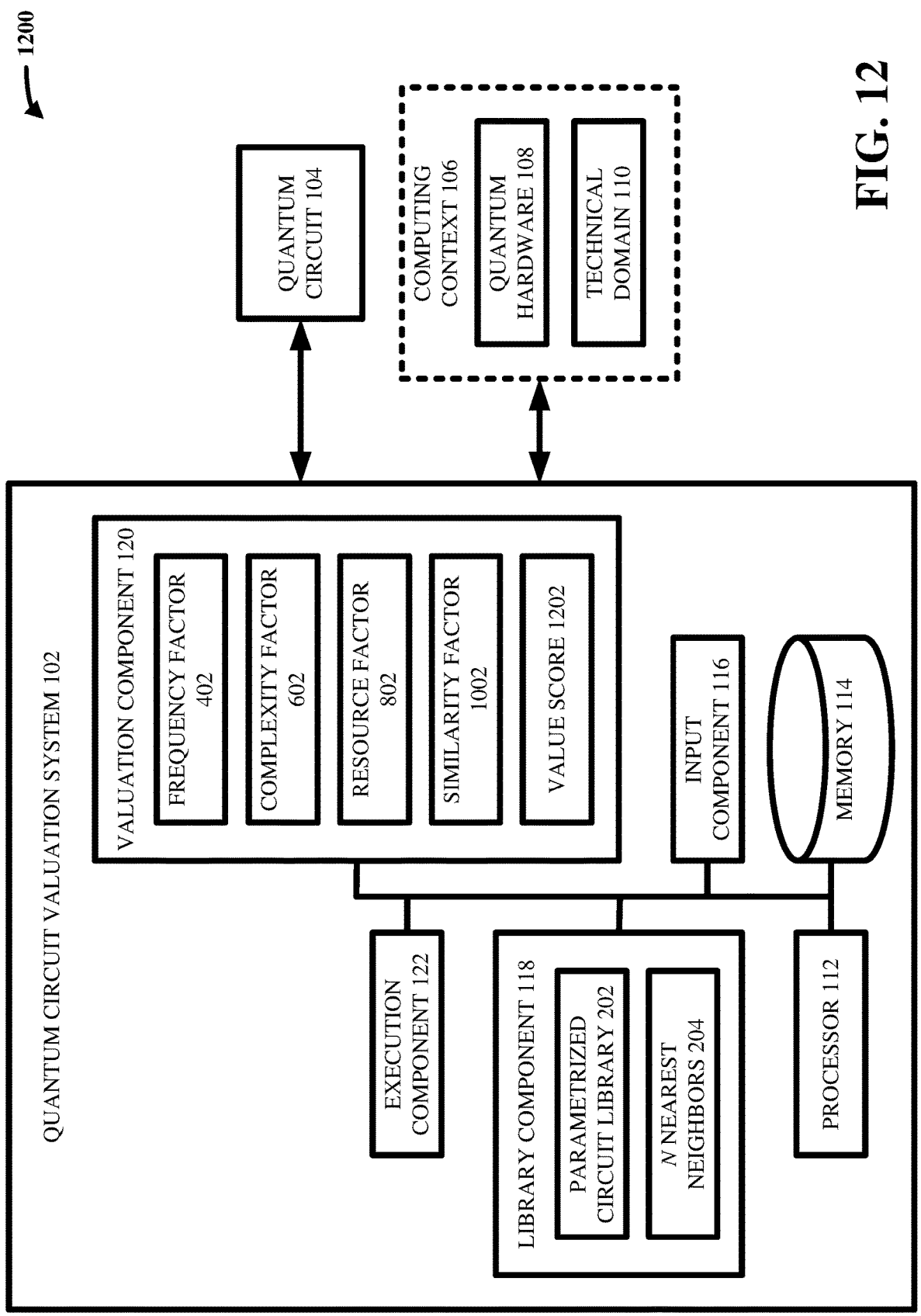
FIG. 12 illustrates a block diagram of an example, non-limiting system including a value score that facilitates quantum circuit valuation in accordance with one or more embodiments described herein.

FIG. 12 illustrates a block diagram of an example, non-limiting system 1200 including a value score that can facilitate quantum circuit valuation in accordance with one or more embodiments described herein. As shown, the system 1200 can, in some cases, comprise the same components as the system 1000, and can further comprise a value score 1202.

In various embodiments, the valuation component 120 can compute a value score 1202 based on the frequency factor 402, the complexity factor 602, the resource factor 802, and/or the similarity factor 1002. As mentioned above, the value score 1202 can be considered as a scalar that represents a level of value, worth, and/or importance of the quantum circuit 104. Because of the above-described definitions of the frequency factor 402, the complexity factor 602, the resource factor 802, and/or the similarity factor 1002, the value score 1202 can be derived based on how often the quantum circuit 104 has been executed, how often circuits that are similar to the quantum circuit 104 have been executed, how complex the structure of the quantum circuit 104 is, how much post-processing and/or pre-processing the quantum circuit 104 would need if implemented on the quantum hardware 108, and/or how similar the quantum circuit 104 is to other circuits that are known to be associated with the technical domain 110.

Those having ordinary skill in the art will appreciate that the value score 1202 can have any suitable magnitude and/or can otherwise be any suitable function of the frequency factor 402, the complexity factor 602, the resource factor 802, and/or the similarity factor 1002. For instance, in some cases, the magnitude of the value score 1202 can be equal to any suitable linear combination of the frequency factor 402, the complexity factor 602, the resource factor 802, and/or the similarity factor 1002. In other cases, the magnitude of the value score 1202 can be equal to any suitable multiplicative combination of the frequency factor 402, the complexity factor 602, the resource factor 802, and/or the similarity factor 1002. In still other cases, the magnitude of the value score 1202 can be normalized, such as by applying a tuned sigmoid function to a linear combination and/or a multiplicative combination of the frequency factor 402, the complexity factor 602, the resource factor 802, and/or the similarity factor 1002. As a specific non-limiting example, the value score 1202 can be given by the following valuation formula:

$$V=F^a C^b R^c S^d$$

where V represents the value score 1202, F represents the frequency factor 402, C represents the complexity factor 602, R represents the resource factor 802, S represents the similarity factor 1002, a represents the exponential weight of the frequency factor 402, b represents the exponential weight of the complexity factor 602, c represents the exponential weight of the resource factor 802, and d represents the exponential weight of the similarity factor 1002. Those having ordinary skill in the art will understand that this valuation formula is a non-limiting example of an exponentially-weighted multiplicative combination of the frequency factor 402, the complexity factor 602, the resource factor 802, and/or the similarity factor 1002. In any case, the value score 1202 can be defined to be any suitable mathematical function of the frequency factor 402, the complexity factor 602, the resource factor 802, and/or the similarity factor 1002.

Figure 13:
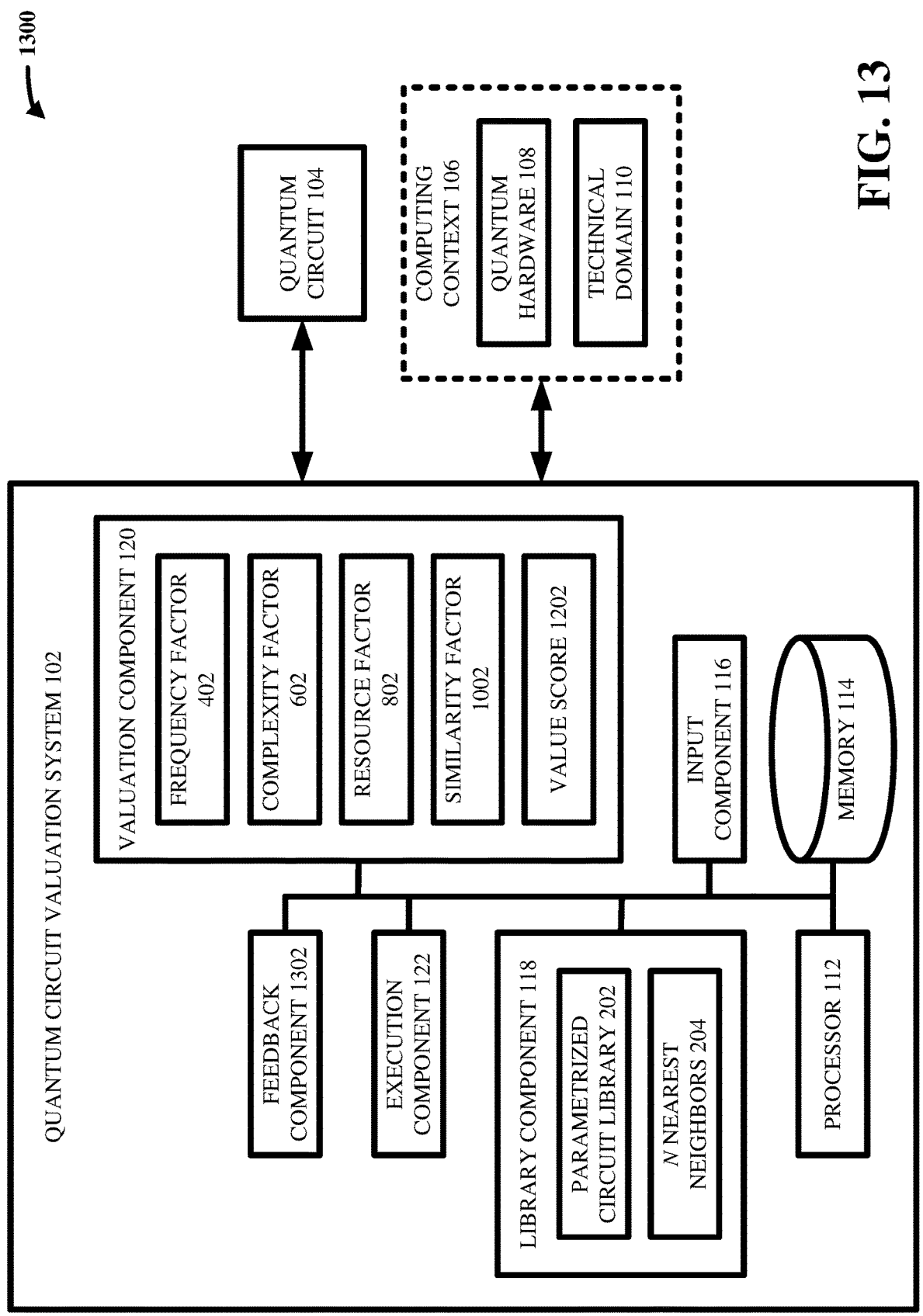
FIG. 13 illustrates a block diagram of an example, non-limiting system including a feedback component that facilitates quantum circuit valuation in accordance with one or more embodiments described herein.

FIG. 13 illustrates a block diagram of an example, non-limiting system 1300 including a feedback component that an facilitate quantum circuit valuation in accordance with one or more embodiments described herein. As shown, the system 1300 can, in some cases, comprise the same components as the system 1200, and can further comprise a feedback component 1302.

In various embodiments, the feedback component 1302 can receive feedback from quantum researchers and/or clients (e.g., from computing devices associated with such quantum researchers and/or clients). In various cases, the library component 118 and/or the valuation component 120 can incorporate such feedback so as to update the value score 1202. For example, in some cases, the numbers of executions/deployments of the quantum circuit 104 and/or of the circuits represented in the parametrized circuit library 202 (e.g., the n nearest neighbors 204) can change with time. In various aspects, the feedback received by the feedback component 1302 can identify those new numbers of executions/deployments. Accordingly, those new numbers of executions/deployments can be incorporated into the parametrized circuit library 202. In various instances, the valuation component 120 can then recompute the frequency factor 402 based on those new numbers of executions/deployments. As another example, it can be the case that new quantum circuits become available over time. Thus, in various cases, the feedback received by the feedback component 1302 can identify such new quantum circuits, and the library component 118 can add such new quantum circuits to the parametrized circuit library 202. In various instances, the library component 118 can then re-identify the n nearest neighbors 204 (e.g., which may be different after the feedback is incorporated), and the valuation component 120 can then recompute the frequency factor 402 and/or the similarity factor 1002 based on these new quantum circuits.

In various embodiments, as mentioned above, the feedback component 1302 can comprise a generative adversarial network (GAN, not shown). In various cases, the GAN can comprise a first neural network known as a generator and a second neural network known as a discriminator. In various aspects, the generator can be configured to receive as input a random scalar/vector and to produce as output a modified version of the valuation formula employed by the valuation component 120. In various instances, the discriminator can be configured to receive as input a valuation formula and to produce as output a determination regarding how well the inputted valuation formula differentiates between known high-value quantum circuits and known low-value quantum circuits in the parametrized circuit library 202.

In other words, various circuits in the parametrized circuit library 202 can be known to have high, intermediate, and/or low levels of value, worth, and/or importance. In various aspects, the discriminator can compute value scores for such circuits based on a valuation formula provided by the generator (e.g., each value score computation can be as described above, based on a frequency factor, complexity factor, resource factor, and/or similarity factor of a given circuit). If the computed value scores are consistent with the known levels of value, worth, and/or importance of such known circuits, the discriminator can indicate that the inputted valuation formula is optimized. However, if the computed value scores are inconsistent with the known levels of value, worth, and/or importance of such known circuits, the discriminator can indicate that the inputted valuation formula is sub-optimal. In various cases, the discriminator can indicate different levels of suboptimality depending upon how many circuits are mis-valued by the valuation formula and/or depending upon how severely the valuation formula mis-values given circuits. In various instances, parameters of the generator can be updated (e.g., via backpropagation) according to the output of the discriminator, and the generator can again produce a modified version of the valuation formula. In various cases, this process can be repeated and/or iterated until the valuation formula is optimized (e.g., until any suitable convergence criterion is met). Those having ordinary skill in the art will appreciate that this setup can be considered as an application of reinforcement learning to generative adversarial networks.

For example, as mentioned above, the valuation formula can take the following form: $V=F^a C^b R^c S^d$. In various cases, F, C, R, and/or S can be computed as described above. In various aspects, the exponents a, b, c, and/or d can be initialized as desired (e.g., randomly initialized, and/or initialized with best guesses). In various instances, the generator of the GAN can be configured to iteratively alter the values of the exponents a, b, c, and/or d until the discriminator determines that the exponents are optimized (e.g., until the discriminator determines that the valuation formula properly differentiates between known high-value, known intermediate-value, and/or known low-value circuits in the parametrized circuit library 202).

Those having ordinary skill in the art will appreciate that, in various embodiments, any other suitable machine learning technique can be implemented to update and/or optimize the valuation formula.

Figure 14:
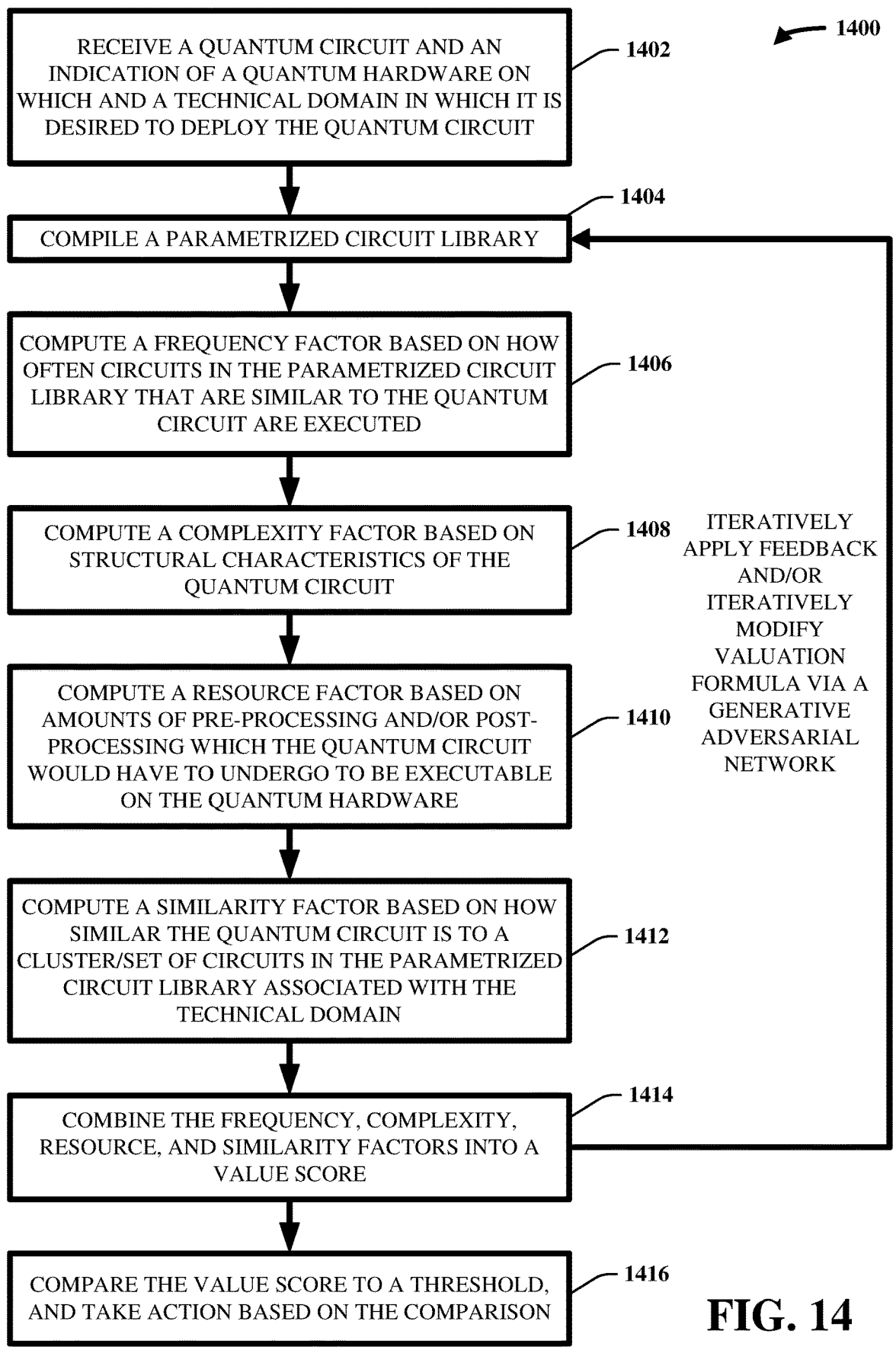
FIG. 14 illustrates a flow diagram of an example, non-limiting computer-implemented method that facilitates quantum circuit valuation in accordance with one or more embodiments described herein.

FIG. 14 illustrates a flow diagram of an example, non-limiting computer-implemented method 1400 that can facilitate quantum circuit valuation in accordance with one or more embodiments described herein. In various cases, the computer-implemented method 1400 can be facilitated by the quantum circuit valuation system 102.

In various embodiments, act 1402 can include receiving, by a device (e.g., 114) operatively coupled to a processor, a quantum circuit (e.g., 104) and/or an indication (e.g., 106) of a quantum hardware (e.g., 108) on which and/or a technical domain (e.g., 110) in which it is desired to deploy the quantum circuit.

In various aspects, act 1404 can include compiling, by the device (e.g., 118), a parametrized circuit library (e.g., 202).

In various instances, act 1406 can include computing, by the device (e.g., 120), a frequency factor (e.g., 402) based on how often circuits (e.g., 204) in the parametrized circuit library that are similar to the quantum circuit are executed.

In various cases, act 1408 can include computing, by the device (e.g., 120), a complexity factor (e.g., 602) based on structural characteristics of the quantum circuit.

In various aspects, act 1410 can include computing, by the device (e.g., 120), a resource factor (e.g., 802) based on amounts of pre-processing and/or post-processing which the quantum circuit would have to undergo to be executable on the quantum hardware.

In various instances, act 1412 can include computing, by the device (e.g., 120), a similarity factor (e.g., 1002) based on how similar the quantum circuit is to a cluster and/or set of circuits in the parametrized library that are known to be associated with the technical domain.

In various cases, act 1414 can include combining, by the device (e.g., 120), the frequency, complexity, resource, and/or similarity factors into a value score (e.g., 1202). In various cases, the computer-implemented method 1400 can proceed back to act 1404 any suitable number of times, so as to iteratively apply feedback and/or to iteratively modify, by a generative adversarial network, a valuation formula used to compute the value score.

In various cases, act 1416 can include comparing, by the device (e.g., 122), the value score to a threshold, and taking, by the device (e.g., 122), action based on the comparison (e.g., executing and/or recommending execution of the quantum circuit if the value score meets and/or exceeds the threshold).

Figure 15:
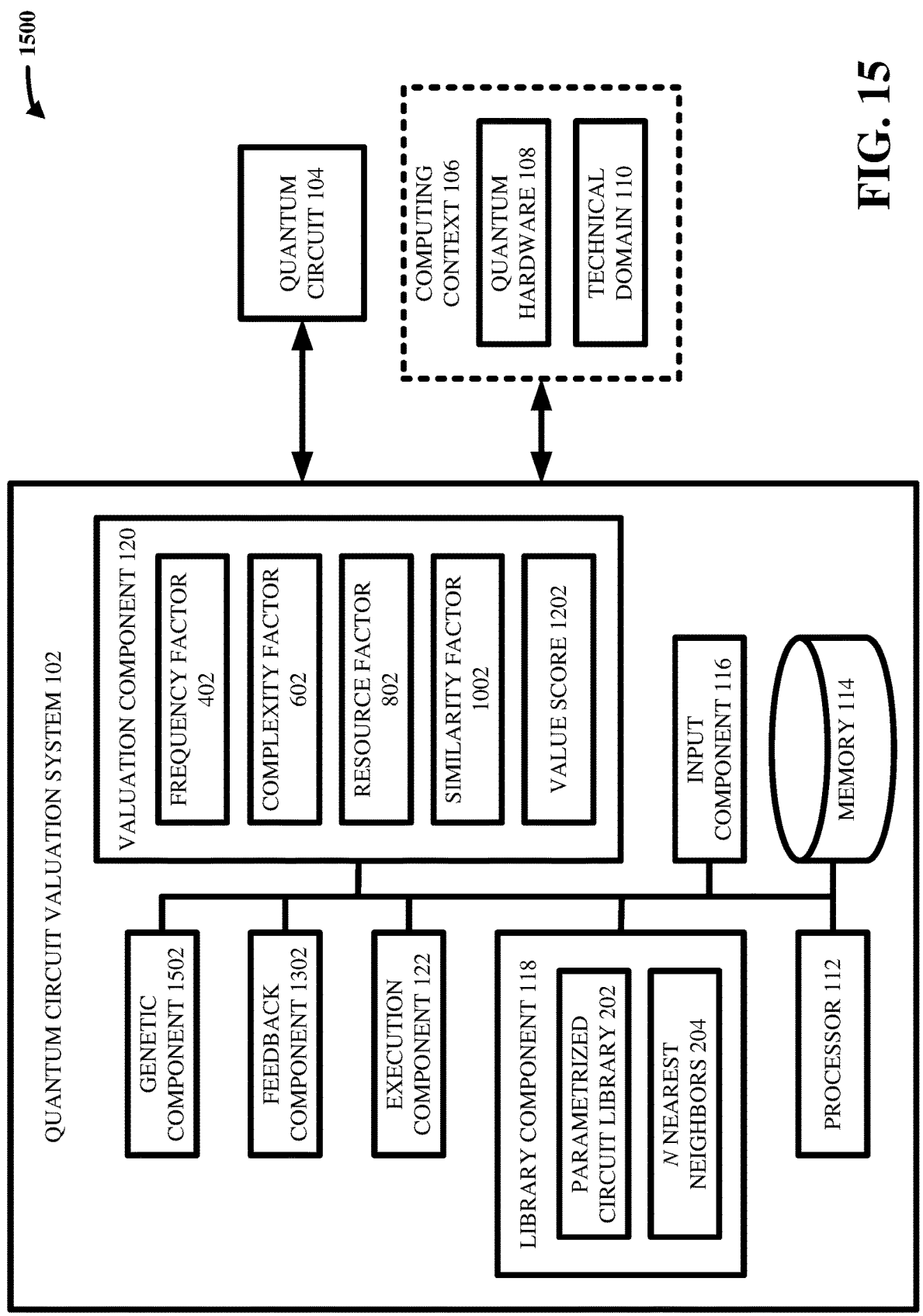
FIG. 15 illustrates a block diagram of an example, non-limiting system including a genetic component that facilitates quantum circuit valuation in accordance with one or more embodiments described herein.

FIG. 15 illustrates a block diagram of an example, non-limiting system 1500 including a genetic component that can facilitate quantum circuit valuation in accordance with one or more embodiments described herein. As shown, the system 1500 can, in some cases, comprise the same components as the system 1300, and can further comprise a genetic component 1502.

In various aspects, the above discussion explains how the quantum circuit valuation system 102 can compute a value score (e.g., 1202) for a single quantum circuit (e.g., 104). In various cases, however, the quantum circuit valuation system 102 can repeat this process any suitable number of times for any suitable number of quantum circuits. Accordingly, in various instances, the quantum circuit valuation system 102 can compute a plurality of value scores for a plurality of quantum circuits. In various cases, the plurality of quantum circuits can thus be organized and/or prioritized in order of ascending and/or descending value score. In some aspects, the genetic component 1502 can identify one or more candidate circuits for genetic modification/evolution based on this list of ascending and/or descending value scores (e.g., the genetic component 1502 can select/identify one or more quantum circuits that have value scores above any suitable threshold). In other words, the genetic component can identify quantum circuits that already have high value scores. In various instances, the genetic component 1502 can apply any suitable genetic algorithms and/or evolutionary modification techniques to such identified quantum circuits. As those having ordinary skill in the art will appreciate, genetic algorithms and/or evolutionary modification techniques are computer-implemented methods by which existing computational tools can be altered and/or improved. In various cases, the value scores assigned by the quantum circuit valuation system 102 can be used to identify promising candidates to which to apply such genetic algorithms and/or evolutionary modification techniques. In this way, the genetic component 1502 can receive as input quantum circuits that already have high value scores, and can produce as output quantum circuits that have even higher value scores.

In various embodiments, higher-value quantum circuits can be identified and/or created by the genetic component 1502 through the application of reinforcement learning techniques. For example, a machine learning model executed by the genetic component 1502 can be trained via reinforcement learning to create a resultant quantum circuit by making modifications to one or more existing quantum circuits. In various aspects, the parameters of the machine learning model can be updated (e.g., via backpropagation) based on how much higher and/or lower the value score of the resultant quantum circuit is compared to the value scores of the one or more existing quantum circuits (e.g., the increase and/or decrease in value score can be considered as the reinforcement learning reward received by the machine learning model).

Figure 16:
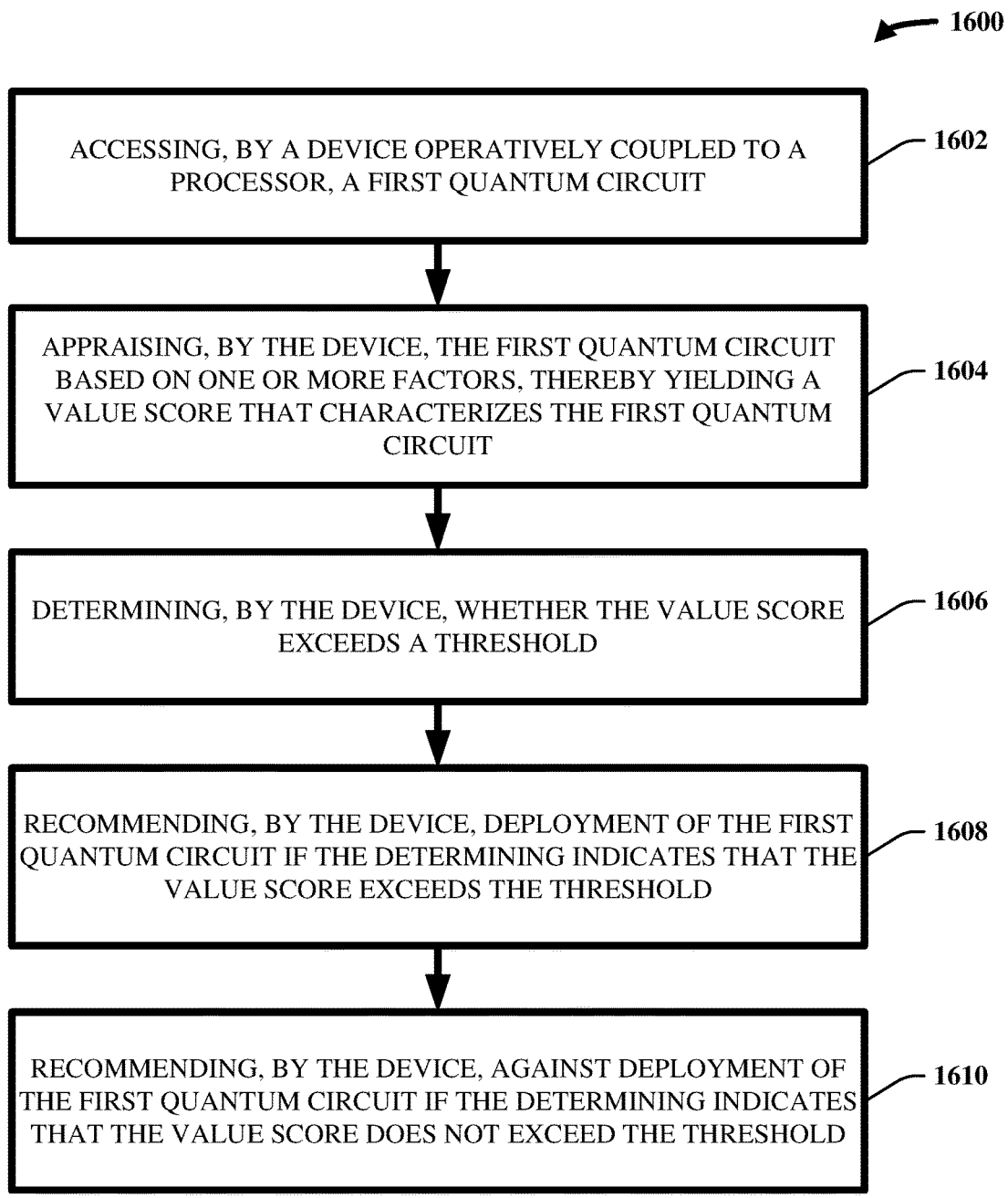
FIG. 16 illustrates a flow diagram of an example, non-limiting computer-implemented method that facilitates quantum circuit valuation in accordance with one or more embodiments described herein.

FIG. 16 illustrates a flow diagram of an example, non-limiting computer-implemented method 1600 that can facilitate quantum circuit valuation in accordance with one or more embodiments described herein. In various cases, the computer-implemented method 1600 can be implemented by the quantum circuit valuation system 102.

In various embodiments, act 1602 can include accessing, by a device (e.g., 114) operatively coupled to a processor, a first quantum circuit (e.g., 104).

In various aspects, act 1604 can include appraising, by the device (e.g., 120), the first quantum circuit based on one or more factors (e.g., 402, 602, 802, 1002), thereby yielding a value score (e.g., 1202) that characterizes the first quantum circuit.

In various instances, act 1606 can include determining, by the device (e.g., 122), whether the value score exceeds a threshold.

In various cases, act 1608 can include recommending, by the device (e.g., 122), deployment of the first quantum circuit if the determining indicates that the value score exceeds the threshold.

In various aspects, act 1610 can include recommending, by the device (e.g., 122), against deployment of the first quantum circuit if the determining indicates that the value score does not exceed the threshold.

Although not explicitly shown in FIG. 16, the one or more factors can include a frequency factor (e.g., 402), and the computer-implemented method 1600 can further comprise: computing, by the device (e.g., 120), the frequency factor based on how often the first quantum circuit is executed.

Although not explicitly shown in FIG. 16, the one or more factors can include a frequency factor (e.g., 402), and the computer-implemented method 1600 can further comprise: compiling, by the device (e.g., 118), a parametrized library (e.g., 202) of existing quantum circuits; identifying, by the device (e.g., 118), one or more nearest neighbors (e.g., 204) of the first quantum circuit, by computing similarity scores between the first quantum circuit and other quantum circuits in the parametrized library of existing quantum circuits; and computing, by the device (e.g., 120), the frequency factor based on how often the one or more nearest neighbors are executed.

Although not explicitly shown in FIG. 16, the one or more factors can include a complexity factor (e.g., 602), and the computer-implemented method 1600 can further comprise: computing, by the device (e.g., 120), the complexity factor based on a depth of the first quantum circuit, a width of the first quantum circuit, and/or one or more gate counts of the first quantum circuit.

Although not explicitly shown in FIG. 16, the one or more factors can include a resource factor (e.g., 802), and the computer-implemented method 1600 can further comprise: computing, by the device (e.g., 120), the resource factor based on an amount of pre-processing which the first quantum circuit requires to be executable on a first quantum hardware (e.g., 108) and/or an amount of error correction which the first quantum circuit requires to be executable on the first quantum hardware.

Although not explicitly shown in FIG. 16, the computer-implemented method 1600 can further comprise: employing, by the device (e.g., 1302), a generative adversarial network that iteratively updates a formula by which the appraising the first quantum circuit yields the value score.

Although not explicitly shown in FIG. 16, the computer-implemented method 1600 can further comprise: determining, by the device (e.g., 1502), that the value score exceeds a threshold; and applying, by the device, a genetic algorithm or an evolutionary algorithm to the first quantum circuit based on the determining, thereby yielding a second quantum circuit having a second value score that exceeds the value score of the first quantum circuit.

As described herein, various embodiments of the invention can automatically and objectively appraise quantum circuits. That is, various embodiments of the invention can assign value scores to quantum circuits, thereby allowing different quantum circuits to be ranked and/or compared against each other. In various instances, a value score can be based on a frequency factor (e.g., how often the quantum circuit and/or similar circuits have been executed), a complexity factor (e.g., how complex the structure of the quantum circuit is), a resource factor (e.g., how much pre-processing and/or post-processing the quantum circuit would require), and/or a similarity factor (e.g., how similar the quantum circuit is to various circuits known to be associated with a given technical field).

Those having ordinary skill in the art will appreciate that these are non-limiting examples of factors on which the value score can be based. For example, in various other cases, the value score can be based on a speed factor. In such case, the magnitude of the speed factor can be defined to be any suitable mathematical function of how quickly the quantum circuit executes, and the value score can be based on the speed factor (e.g., the valuation formula utilized by the valuation component 120 can take as an argument the speed factor). For instance, a quantum circuit that consumes less than any suitable threshold amount of time during execution can have a high speed factor, whereas a quantum circuit that consumes more than any suitable threshold amount of time during execution can have a low speed factor. As another example, in various cases, the value score can be based on a revenue factor. In such case, the magnitude of the revenue factor can be any suitable mathematical function of how similar the quantum circuit is to various other circuits that are known to be profitable (e.g., the valuation formula utilized by the valuation component 120 can take as an argument the revenue factor). For instance, a quantum circuit that is similar to circuits that are known to be above any suitable profitability threshold can have a high revenue factor, whereas a quantum circuit that is dissimilar to circuits that are known to be above any suitable profitability threshold can have a low revenue factor. As yet another example, in various cases, the value score can be based on a news factor. In such case, the magnitude of the news factor can be any suitable mathematical function of how similar the quantum circuit is to various other circuits that are known to have been discussed in news articles and/or research papers more than any suitable threshold number of times (e.g., the valuation formula utilized by the valuation component 120 can take as an argument the news factor). For instance, a quantum circuit that is similar to circuits that are known to be discussed and/or referenced in more than any suitable threshold number of research papers can have a high news factor, whereas a quantum circuit that is dissimilar to circuits that are known to be discussed and/or referenced in more than any suitable threshold number of research papers can have a low news factor. As still another example, the value score can be based on a precision factor. In such case, the magnitude of the precision factor can be any suitable mathematical function of a qubit amplitudes and/or phases (e.g., the valuation formula utilized by the valuation component 120 can take as an argument the precision factor). For instance, a qubit amplitude can range from 0 to $\pi/2$ and/or a qubit phase can range from to 0 to $2\pi$. When qubit amplitudes and/or phases are small and/or otherwise below any suitable threshold (e.g., set to $\pi/256$ instead of $\pi/3$), the precision factor can be large. On the other hand, when qubit amplitudes and/or phases are large and/or otherwise above any suitable threshold (e.g., set to $\pi/3$ instead of $\pi/256$), the precision factor can be small. In various embodiments, any other suitable factors can be implemented.

Figure 17:
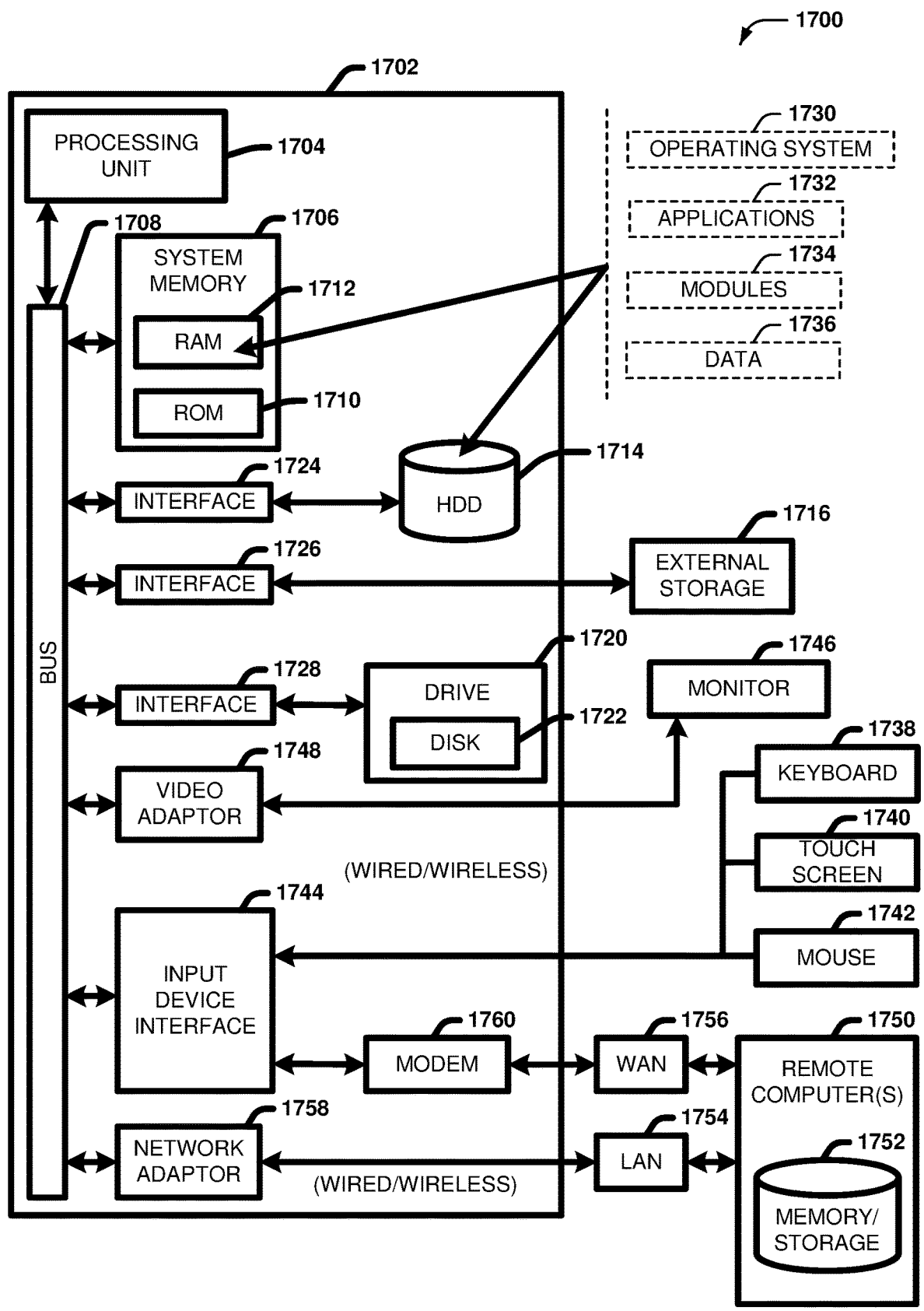
FIG. 17 illustrates a block diagram of an example, non-limiting operating environment in which one or more embodiments described herein can be facilitated.

In order to provide additional context for various embodiments described herein, FIG. 17 and the following discussion are intended to provide a brief, general description of a suitable computing environment 1700 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 17, the example environment 1700 for implementing various embodiments of the aspects described herein includes a computer 1702, the computer 1702 including a processing unit 1704, a system memory 1706 and a system bus 1708. The system bus 1708 couples system components including, but not limited to, the system memory 1706 to the processing unit 1704. The processing unit 1704 can be any of various commercially available processors. Dual microprocessors and other multi-processor architectures can also be employed as the processing unit 1704.

The system bus 1708 can be any of several types of bus structure that can further interconnect to a memory bus (with or without a memory controller), a peripheral bus, and a local bus using any of a variety of commercially available bus architectures. The system memory 1706 includes ROM 1710 and RAM 1712. A basic input/output system (BIOS) can be stored in a nonvolatile memory such as ROM, erasable programmable read only memory (EPROM), EEPROM, which BIOS contains the basic routines that help to transfer information between elements within the computer 1702, such as during startup. The RAM 1712 can also include a high-speed RAM such as static RAM for caching data.

The computer 1702 further includes an internal hard disk drive (HDD) 1714 (e.g., EIDE, SATA), one or more external storage devices 1716 (e.g., a magnetic floppy disk drive (FDD) 1716, a memory stick or flash drive reader, a memory card reader, etc.) and a drive 1720, e.g., such as a solid state drive, an optical disk drive, which can read or write from a disk 1722, such as a CD-ROM disc, a DVD, a BD, etc. Alternatively, where a solid state drive is involved, disk 1722 would not be included, unless separate. While the internal HDD 1714 is illustrated as located within the computer 1702, the internal HDD 1714 can also be configured for external use in a suitable chassis (not shown). Additionally, while not shown in environment 1700, a solid state drive (SSD) could be used in addition to, or in place of, an HDD 1714. The HDD 1714, external storage device(s) 1716 and drive 1720 can be connected to the system bus 1708 by an HDD interface 1724, an external storage interface 1726 and a drive interface 1728, respectively. The interface 1724 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1702, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1712, including an operating system 1730, one or more application programs 1732, other program modules 1734 and program data 1736. All or portions of the operating system, applications, modules, and/or data can also be cached in the RAM 1712. The systems and methods described herein can be implemented utilizing various commercially available operating systems or combinations of operating systems.

Computer 1702 can optionally comprise emulation technologies. For example, a hypervisor (not shown) or other intermediary can emulate a hardware environment for operating system 1730, and the emulated hardware can optionally be different from the hardware illustrated in FIG. 17. In such an embodiment, operating system 1730 can comprise one virtual machine (VM) of multiple VMs hosted at computer 1702. Furthermore, operating system 1730 can provide runtime environments, such as the Java runtime environment or the .NET framework, for applications 1732. Runtime environments are consistent execution environments that allow applications 1732 to run on any operating system that includes the runtime environment. Similarly, operating system 1730 can support containers, and applications 1732 can be in the form of containers, which are lightweight, standalone, executable packages of software that include, e.g., code, runtime, system tools, system libraries and settings for an application.

Further, computer 1702 can be enable with a security module, such as a trusted processing module (TPM). For instance with a TPM, boot components hash next in time boot components, and wait for a match of results to secured values, before loading a next boot component. This process can take place at any layer in the code execution stack of computer 1702, e.g., applied at the application execution level or at the operating system (OS) kernel level, thereby enabling security at any level of code execution.

A user can enter commands and information into the computer 1702 through one or more wired/wireless input devices, e.g., a keyboard 1738, a touch screen 1740, and a pointing device, such as a mouse 1742. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1704 through an input device interface 1744 that can be coupled to the system bus 1708, but can be connected by other interfaces, such as a parallel port, an IEEE 1394 serial port, a game port, a USB port, an IR interface, a BLUETOOTH® interface, etc.

A monitor 1746 or other type of display device can be also connected to the system bus 1708 via an interface, such as a video adapter 1748. In addition to the monitor 1746, a computer typically includes other peripheral output devices (not shown), such as speakers, printers, etc.

The computer 1702 can operate in a networked environment using logical connections via wired and/or wireless communications to one or more remote computers, such as a remote computer(s) 1750. The remote computer(s) 1750 can be a workstation, a server computer, a router, a personal computer, portable computer, microprocessor-based entertainment appliance, a peer device or other common network node, and typically includes many or all of the elements described relative to the computer 1702, although, for purposes of brevity, only a memory/storage device 1752 is illustrated. The logical connections depicted include wired/wireless connectivity to a local area network (LAN) 1754 and/or larger networks, e.g., a wide area network (WAN) 1756. Such LAN and WAN networking environments are commonplace in offices and companies, and facilitate enterprise-wide computer networks, such as intranets, all of which can connect to a global communications network, e.g., the Internet.

When used in a LAN networking environment, the computer 1702 can be connected to the local network 1754 through a wired and/or wireless communication network interface or adapter 1758. The adapter 1758 can facilitate wired or wireless communication to the LAN 1754, which can also include a wireless access point (AP) disposed thereon for communicating with the adapter 1758 in a wireless mode.

When used in a WAN networking environment, the computer 1702 can include a modem 1760 or can be connected to a communications server on the WAN 1756 via other means for establishing communications over the WAN 1756, such as by way of the Internet. The modem 1760, which can be internal or external and a wired or wireless device, can be connected to the system bus 1708 via the input device interface 1744. In a networked environment, program modules depicted relative to the computer 1702 or portions thereof, can be stored in the remote memory/storage device 1752. It will be appreciated that the network connections shown are example and other means of establishing a communications link between the computers can be used.

When used in either a LAN or WAN networking environment, the computer 1702 can access cloud storage systems or other network-based storage systems in addition to, or in place of, external storage devices 1716 as described above, such as but not limited to a network virtual machine providing one or more aspects of storage or processing of information. Generally, a connection between the computer 1702 and a cloud storage system can be established over a LAN 1754 or WAN 1756 e.g., by the adapter 1758 or modem 1760, respectively. Upon connecting the computer 1702 to an associated cloud storage system, the external storage interface 1726 can, with the aid of the adapter 1758 and/or modem 1760, manage storage provided by the cloud storage system as it would other types of external storage. For instance, the external storage interface 1726 can be configured to provide access to cloud storage sources as if those sources were physically connected to the computer 1702.

The computer 1702 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

Figure 18:
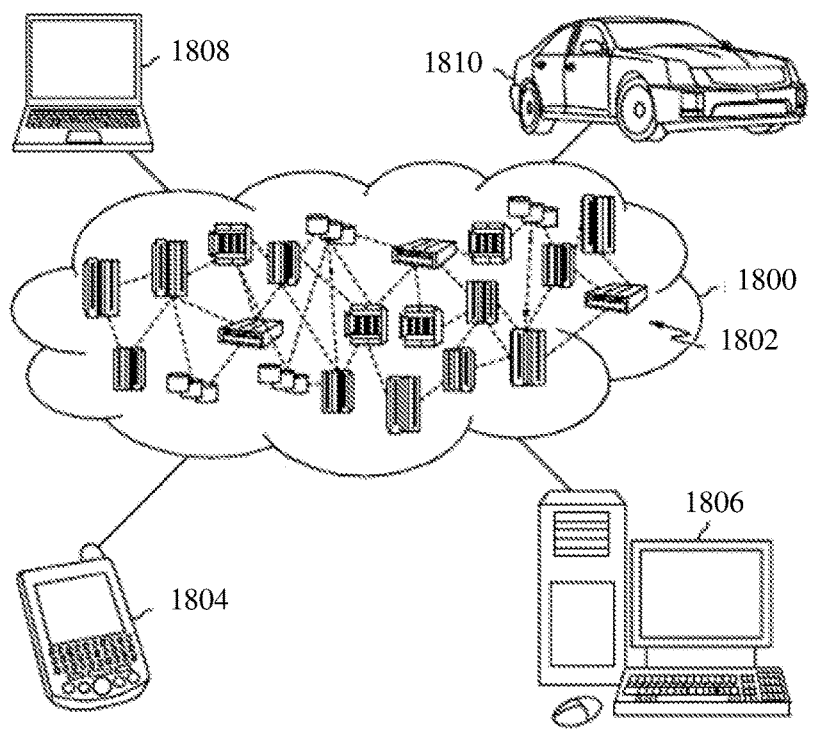
FIG. 18 illustrates an example, non-limiting cloud computing environment in accordance with one or more embodiments described herein.

Referring now to FIG. 18, illustrative cloud computing environment 1800 is depicted. As shown, cloud computing environment 1800 includes one or more cloud computing nodes 1802 with which local computing devices used by cloud consumers, such as, for example, personal digital assistant (PDA) or cellular telephone 1804, desktop computer 1806, laptop computer 1808, and/or automobile computer system 1810 may communicate. Nodes 1802 may communicate with one another. They may be grouped (not shown) physically or virtually, in one or more networks, such as Private, Community, Public, or Hybrid clouds as described hereinabove, or a combination thereof. This allows cloud computing environment 1800 to offer infrastructure, platforms and/or software as services for which a cloud consumer does not need to maintain resources on a local computing device. It is understood that the types of computing devices 1804-1810 shown in FIG. 18 are intended to be illustrative only and that computing nodes 1802 and cloud computing environment 1800 can communicate with any type of computerized device over any type of network and/or network addressable connection (e.g., using a web browser).

Figure 19:
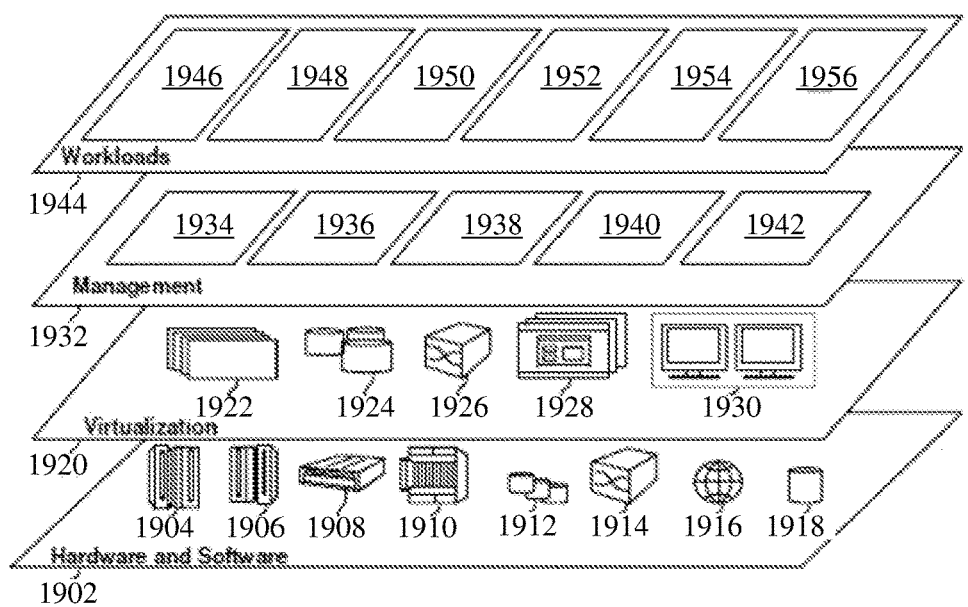
FIG. 19 illustrates example, non-limiting abstraction model layers in accordance with one or more embodiments described herein.

Referring now to FIG. 19, a set of functional abstraction layers provided by cloud computing environment 1800 (FIG. 18) is shown. Repetitive description of like elements employed in other embodiments described herein is omitted for sake of brevity. It should be understood in advance that the components, layers, and functions shown in FIG. 19 are intended to be illustrative only and embodiments of the invention are not limited thereto. As depicted, the following layers and corresponding functions are provided.

Hardware and software layer 1902 includes hardware and software components. Examples of hardware components include: mainframes 1904; RISC (Reduced Instruction Set Computer) architecture based servers 1906; servers 1908; blade servers 1910; storage devices 1912; and networks and networking components 1914. In some embodiments, software components include network application server software 1916 and database software 1918.

Virtualization layer 1920 provides an abstraction layer from which the following examples of virtual entities may be provided: virtual servers 1922; virtual storage 1924; virtual networks 1926, including virtual private networks; virtual applications and operating systems 1928; and virtual clients 1930.

In one example, management layer 1932 may provide the functions described below. Resource provisioning 1934 provides dynamic procurement of computing resources and other resources that are utilized to perform tasks within the cloud computing environment. Metering and Pricing 1936 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1938 provides access to the cloud computing environment for consumers and system administrators. Service level management 1940 provides cloud computing resource allocation and management such that required service levels are met. Service Level Agreement (SLA) planning and fulfillment 1942 provide pre-arrangement for, and procurement of, cloud computing resources for which a future requirement is anticipated in accordance with an SLA.

Workloads layer 1944 provides examples of functionality for which the cloud computing environment may be utilized. Examples of workloads and functions which may be provided from this layer include: mapping and navigation 1946; software development and lifecycle management 1948; virtual classroom education delivery 1950; data analytics processing 1952; transaction processing 1954; and differentially private federated learning processing 1956. Various embodiments of the present invention can utilize the cloud computing environment described with reference to FIGS. 18 and 19 to execute one or more differentially private federated learning process in accordance with various embodiments described herein.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
    a memory that stores computer-executable components; and
    a processor that executes at least one of computer-executable components that:
        trains a neural network to determine value scores for quantum circuits based on factors with respect to other quantum circuits having a defined level of similarity to the quantum circuits; and
        determines, using the neural network, a value score for a first quantum circuit in a defined computing context based on the factors with respect to second quantum circuits having the defined level of similarity to the first quantum circuit, wherein the value score indicates a level of value of the first quantum circuit when executed in the defined computing context relative to the second quantum circuits that have a known effectiveness when executed in the defined computing context, wherein the first quantum circuit is different from the second quantum circuits, and wherein the factors comprise a frequency factor based on respective frequencies of execution of the second quantum circuits.

2. The system of claim 1, wherein the factors further comprise a complexity factor indicative of an amount of quantum circuit complexity of the first quantum circuit.

3. The system of claim 1, wherein the determining the value score is based on weighted combination of the factors.

4. The system of claim 1, wherein the factors further comprise a resource factor indicative of an amount of at least one of quantum circuit pre-processing or quantum circuit post-processing needed for execution of the first quantum circuit on a defined quantum hardware configuration.

5. The system of claim 1, wherein the factors further comprise a similarity factor indicative of an amount of similarity between the first quantum circuit and the second quantum circuits.

6. The system of claim 1, wherein the at least one of the computer-executable components further:
    applies a genetic algorithm to the first quantum circuit based on determining that the value score exceeds a threshold, thereby yielding a third quantum circuit having a second value score that exceeds the value score of the first quantum circuit.

7. The system of claim 1, wherein the defined level of similarity is based on at least one of gate count, circuit depth, circuit width, resultant quantum state, computation time, number of executions, or technical domain.

8. A computer-implemented method, comprising:
    training, by a device operatively coupled to a processor, a neural network to determine value scores for quantum circuits based on factors with respect to other quantum circuits having a defined level of similarity to the quantum circuits; and
    determining, by the device, using the neural network, a value score for a first quantum circuit in a defined computing context based on the factors with respect to second quantum circuits having the defined level of similarity to the first quantum circuit, wherein the value score indicates a level of value of the first quantum circuit when executed in the defined computing context relative to the second quantum circuits that have a known effectiveness when executed in the defined computing context, wherein the first quantum circuit is different from the second quantum circuits, and wherein the factors comprise a frequency factor based on respective frequencies of execution of the second quantum circuits.

9. The computer-implemented method of claim 8, wherein the factors comprise a complexity factor indicative of an amount of quantum circuit complexity of the first quantum circuit.

10. The computer-implemented method of claim 8, wherein the determining the value score is based on weighted combination of the factors.

11. The computer-implemented method of claim 8, wherein the factors further comprise a resource factor indicative of an amount of at least one of quantum circuit pre-processing or quantum circuit post-processing needed for execution of the first quantum circuit on a defined quantum hardware configuration.

12. The computer-implemented method of claim 8, wherein the factors further comprise a similarity factor indicative of an amount of similarity between the first quantum circuit and the second quantum circuits.

13. The computer-implemented method of claim 8, further comprising:
in response to determining that the value score exceeds a threshold, generating, by the device, using an evolutionary algorithm on the first quantum circuit, a third quantum circuit having a second value score that exceeds the value score of the first quantum circuit.

14. The computer-implemented method of claim 8, wherein the defined level of similarity is based on at least one of gate count, circuit depth, circuit width, resultant quantum state, computation time, number of executions, or technical domain.

15. A computer program product for facilitating quantum circuit valuation, the computer program product comprising a computer-readable memory having program instructions embodied therewith, the program instructions executable by a processor to cause the processor to:
train, by the processor, a neural network to determine value scores for quantum circuits based on factors with respect to other quantum circuits having a defined level of similarity to the quantum circuits; and
determining, by the processor, using the neural network, a value score for a first quantum circuit in a defined computing context based on the factors with respect to second quantum circuits having the defined level of similarity to the first quantum circuit, wherein the value score indicates a level of value of the first quantum circuit when executed in the defined computing context relative to the second quantum circuits that have a known effectiveness when executed in the defined computing context, wherein the first quantum circuit is different from the second quantum circuits, and wherein the factors comprise a freqency factor based on respective frequencies of execution of the second quantum circuits.

16. The computer program product of claim 15, wherein the factors comprise a complexity factor indicative of an amount of quantum circuit complexity of the first quantum circuit.

17. The computer program product of claim 15, wherein the determining the value score is based on weighted combination of the factors.

18. The computer program product of claim 15, wherein the factors further comprise a resource factor indicative of an amount of at least one of quantum circuit pre-processing or quantum circuit post-processing needed for execution of the first quantum circuit on a defined quantum hardware configuration.

19. The computer program product of claim 15, wherein the factors further comprise a similarity factor indicative of an amount of similarity between the first quantum circuit and the second quantum circuits.

20. The computer program product of claim 15, wherein the program instructions are further executable to cause the processor to:
in response to determining that the value score exceeds a threshold, generating, by the processor, using a machine learning model on the first quantum circuit, a third quantum circuit having a second value score that exceeds the value score of the first quantum circuit.

* * * * *